(12) United States Patent
Varnica et al.

(10) Patent No.: US 8,504,887 B1
(45) Date of Patent: Aug. 6, 2013

(54) LOW POWER LDPC DECODING UNDER DEFECTS/ERASURES/PUNCTURING

(75) Inventors: Nedeljko Varnica, Sunnyvale, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 296 days.

(21) Appl. No.: 12/967,669

(22) Filed: Dec. 14, 2010

Related U.S. Application Data

(60) Provisional application No. 61/290,112, filed on Dec. 24, 2009.

(51) Int. Cl.
*G06F 11/00* (2006.01)

(52) U.S. Cl.
USPC ............ 714/730; 714/790; 714/758; 714/752

(58) Field of Classification Search
None
See application file for complete search history.

(56) References Cited

U.S. PATENT DOCUMENTS

| | | | | |
|---|---|---|---|---|
| 6,061,823 | A * | 5/2000 | Nara | 714/758 |
| 8,181,097 | B2 * | 5/2012 | Bae | 714/790 |
| 2007/0101243 | A1 * | 5/2007 | Kim et al. | 714/790 |
| 2011/0087933 | A1 * | 4/2011 | Varnica et al. | 714/704 |

* cited by examiner

*Primary Examiner* — Christopher McCarthy

(57) ABSTRACT

This disclosure relates generally to low power data decoding, and more particularly to low power data decoders for use under defects, erasures, and puncturing, with a low density parity check (LDPC) encoder. Systems and methods are disclosed for decoding a vector with punctured, detected defect and/or erased bits. Systems and methods are also disclosed for decoding a vector with undetected defects and/or unknown error patterns. Low power decoding may be performed in an LDPC decoder during the process of decoding an LDPC code in the case of defects, erasures, and puncturing. The low power techniques described herein may reduce power consumption without a substantial decrease in performance of the applications that make use of LDPC codes, or the devices that make use of low power LDPC decoders.

19 Claims, 12 Drawing Sheets

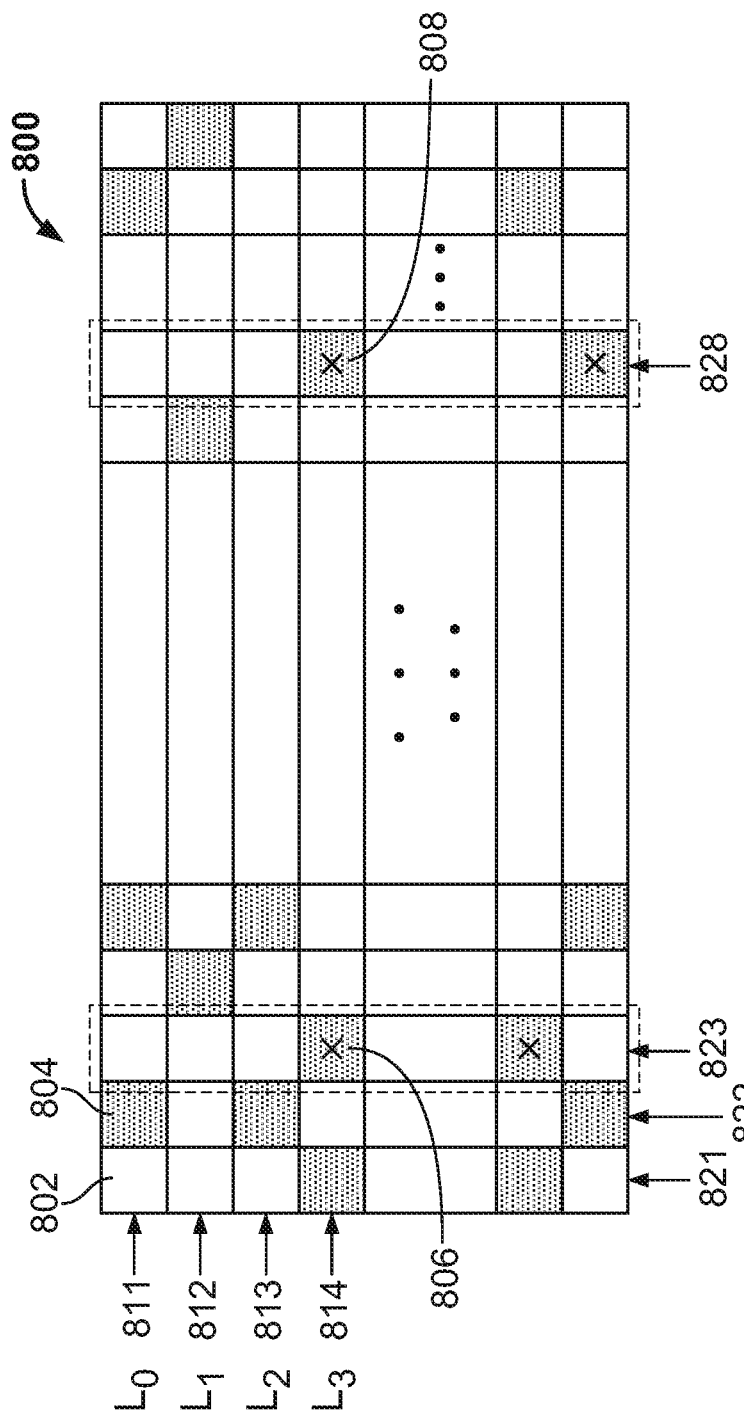

US 8,504,887 B1

LOW POWER LDPC DECODING UNDER DEFECTS/ERASURES/PUNCTURING

CROSS-REFERENCE TO RELATED APPLICATIONS

This claims the benefit under 35 U.S.C. §119(e) of U.S. Provisional Application No. 61/290,112, filed Dec. 24, 2009, the contents of which is hereby incorporated by reference herein in its entirety.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

This disclosure relates generally to low power data decoding, and more particularly to low power data decoders for use under defects, erasures, and puncturing, with a low density parity check (LDPC) encoder/decoder.

LDPC codes may be used for effectively correcting errors in information transmitted in a noisy communications channel. The information may be encoded (e.g., by an LDPC encoder) prior to transmission and then subsequently decoded (e.g., by an LDPC decoder) when received. LDPC codes are one of the best performing error correcting codes, along with Turbo codes, for use in correcting errors in information transmitted on almost all communication and data storage channels in use. These codes can be found in numerous IEEE standards that have been developed in the recent past.

LDPC codes may be defined by one of many different types of parity check matrices. The structure of an LDPC code's parity check matrix may be, for example, random, cyclic, or quasi-cyclic. An LDPC decoder (e.g., a flooding decoder) may decode LDPC codes using an iterative message passing algorithm (flooding decoding), such as a min-sum decoding algorithm. Such algorithms may decode a received codeword using an iterative process in which each iteration includes two update steps involving check nodes and variable nodes passing messages to one another. Another LDPC decoder (e.g., a layered decoder) may use a layered approach to decoding (layered decoding) to decode LDPC codes. Both approaches involve messages being updated and stored. As used herein, the term message refers to a numerical value, usually representing a log likelihood ratio (LLR) calculated based on the information (e.g., a vector) received from a communications channel by an LDPC decoder. LDPC codes and decoders that are used to decode LDPC codes may be used in numerous applications and devices. For example, data storage, satellite communications, wireless communications, wire-line communications, and power line communications are applications that may each require the use of LDPC codes and LDPC decoders. Devices such as digital camera flash memory storage, embedded MultiMediaCard (eMMC) Flash devices, Solid State Device (SSD) storage, satellites, mobile phones, and other mobile devices may each require the use of LDPC codes and LDPC decoders.

The code rate of a particular code used to encode information (e.g., an LDPC code) is a unit of measure corresponding to the number of information bits contained in a codeword. Specifically, the code rate is the ratio of the number of information bits to the total number of bits transmitted within the codeword (e.g., information bits plus parity bits). Flexible code rates may be provided by selectively reducing the length of a codeword, at the time it is transmitted, compared to the full length of the codeword, as initially encoded. Puncturing is one approach that can be used for reducing the codeword length. In this approach, certain bits of the codeword, as initially encoded, are simply not transmitted. Puncturing may be constrained to the parity bits of the codeword; however, information bits may also be punctured if desired. During the decoding of the punctured codeword, the missing (i.e., punctured) bits are reconstructed from the transmitted bits of the codeword using the error correction properties of the code being applied. In some instances, puncturing parity bits increases the code rate of the transmission at a cost of code performance (i.e., a higher error rate for a given signal-to-noise ratio (SNR)). In addition, performing error checks (e.g., parity syndrome checks) on information with punctured bits may waste power and decrease performance in applications that require error correction.

Due to interference signals and other types of noise and phenomena, encoded information may get corrupted during transmission. For example, transmitted information may contain defect bits, which refer to bits with a low reliability value that are identified as potential errors bits. As an example, a reliability value is an absolute value of the LLR messages associated with the bits/symbols of the corresponding vector. Additionally, transmitted information may contain erasures, which refer to the total loss or substantial corruption of a set of bits/symbols. Like puncturing, defects and erasures may waste power and substantially decrease the performance of a decoder.

Traditional decoders (e.g., LDPC decoders) that operate on data with known error patterns, detected errors (e.g., defects), erasures, and/or punctures may disadvantageously consume a large amount of power at a high rate. In addition, the performance of these traditional decoders may be degraded due to the additional time required to process defect, erased and/or punctured bits. Similarly, traditional decoders that operate on data with unknown error patterns or undetected errors may likewise require a high rate of power consumption. The performance of these traditional decoders may also be degraded because of the additional time required to process each data bit. Moreover, performance of traditional decoders may deteriorate during the life of a device. For instance, the signal-to-noise ratio (SNR) associated with data transmission in the device may initially be high, reflecting, for example, good quality channel conditions and data reliability. However, the SNR may degrade over the life of the device, as the device, for example, ages and/or is used more times.

SUMMARY OF THE DISCLOSURE

In accordance with the principles of the present disclosure, methods and apparatus are provided for low power LDPC decoders under defects, erasures and puncturing, that do not cause a substantial decrease in performance and that can be used in order to prolong the battery life of the mobile devices. LDPC decoders are disclosed that implement low power techniques to reduce the power consumed in the process of decoding LDPC codes under defects, erasures and puncturing. The low-power techniques described herein may reduce power consumption without a substantial decrease in performance of the applications that make use of LDPC codes or the devices that make use of low power LDPC decoders.

In some embodiments, a priority is assigned to each bit in a group of bits of a vector received from a communications channel. The group of bits includes at least a defect bit, an erased bit, and/or a punctured bit. For example, a high priority may be assigned to all defect bits of the group of bits of the received vector. An order in which to process each bit in the group is determined based on the assigned priority. Each bit in the group is decoded according to the determined order using decoder circuitry.

In some embodiments, a priority is assigned to each bit in a plurality of columns of a parity check matrix associated with a received vector. The plurality of columns may be associated with at least one decoding layer. An order in which to process each bit is determined based on the assigned priority, and corresponds to an ordering of decoding layers.

In some embodiments, a first value (e.g., a hard decision value) is computed for a unique bit in a received vector after the unique bit has been processed a first time. A second value is computed for the same unique bit after it has been processed a second time. If the first value is equal to the second value, then low power decoding is performed on the received vector to output a decoded vector.

The following description of exemplary embodiments of the present disclosure provides illustration and description, but is not intended to be exhaustive or to limit the disclosure to the precise form disclosed. Modifications and variations are possible in light of the above teachings or may be acquired from practice of what is disclosed herein. For example, while an LDPC decoder is described with relation to the figures included in the present disclosure, this element may be replaced by any type of decoder (e.g., a Turbo Code decoder, a layered decoder, or a flooding decoder). The decoder may make use of either hard information (e.g., using a hard decoder such as a bit-flipping decoder) or soft information (e.g., using an iterative soft decoder) to decode incoming information. While certain components of the present disclosure have been described as implemented in hardware and others in software, other configurations may be possible.

BRIEF DESCRIPTION OF THE FIGURES

The above and other aspects and advantages of the present disclosure will be apparent upon consideration of the following detailed description, taken in conjunction with the accompanying drawings, in which like reference characters refer to like parts throughout, and in which:

FIGS. 8A and 8B show a parity check matrix in a mother matrix representation that illustrates the decoder processing of a received vector with known defects and/or punctured bits in accordance with some embodiments;

DETAILED DESCRIPTION OF THE DISCLOSURE

Systems and methods are provided for reducing the power consumed by LDPC decoders for received vectors with defect, erased and/or punctured bits while substantially maintaining or improving the performance of the decoders. In applications and devices where information may be altered by interference signals or other phenomena, error-correction codes, such as LDPC codes, may provide a measured way to protect information against such interference. Additionally, in applications that use puncturing, error-correction codes, such as LDPC codes, may provide a measured way to reconstruct information from the transmitted punctured data. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
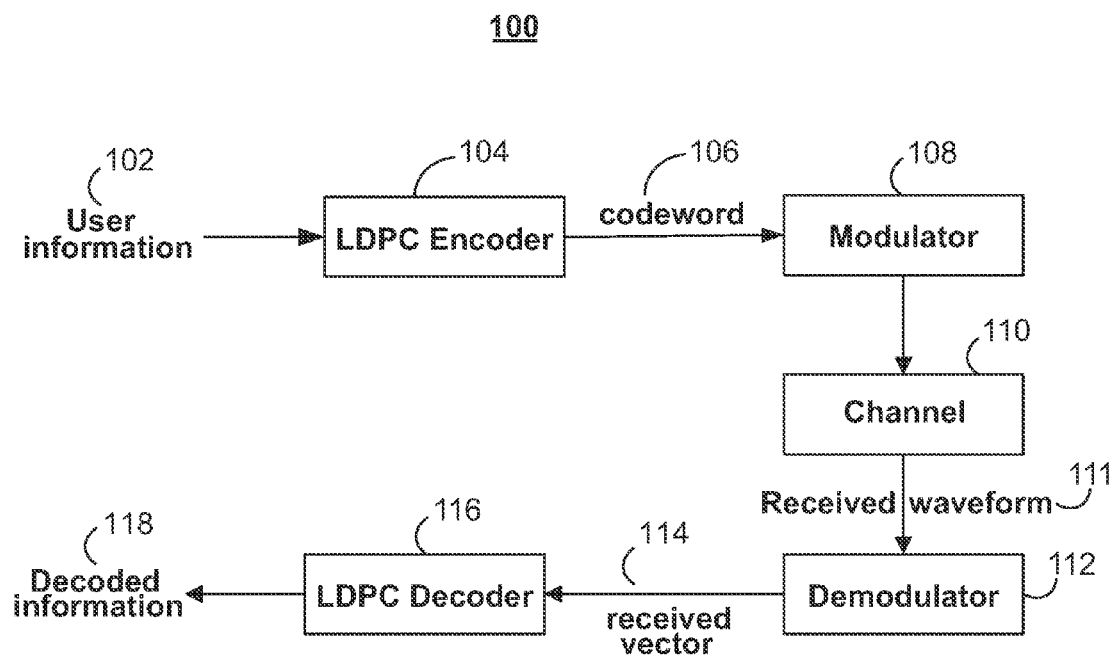
FIG. 1 shows an illustrative block diagram of an error-correcting communication/storage system in accordance with some embodiments.

FIG. 1 shows an illustrative communication or data storage system 100 that utilizes error-correction codes for achieving reliable communication or storage in accordance with some embodiments. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present disclosure will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length that may be referred to as n, where $n \geq k$.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 represents media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114 and this result may contain errors due to channel corruption.

Received vector 114 may then be processed by LDPC decoder 116. LDPC decoder 116 may be located inside of any device. For example, LDPC decoder 116 may be located inside of a flash memory storage, an embedded MultiMediaCard (eMMC) Flash device, a Solid State Device (SSD) storage, a mobile device, a phone, or a satellite. LDPC decoder 116 may have low power circuitry and monitoring circuitry to facilitate a substantial reduction in power consumption in the LDPC decoder. LDPC decoder 116 is used to correct or detect errors in received vector 114. For example, LDPC decoder 116 is capable of detecting and/or correcting errors such as defects or erasures, and punctured bits, produced by LDPC encoder 104 or by transmission of information on channel 110. LDPC decoder 116 may use an iterative message-passing algorithm (e.g. layered decoding) to correct errors in received vector 114. LDPC decoder 116 calculates or receives an initial log-likelihood-ratio (LLR) message that represents a bit reliability value for the bits of received vector 114. For example, LDPC decoder 116 computes a LLR message using the equation $$LLR(b_i) = \log\left(\frac{P(b_i = 0)}{P(b_i = 1)}\right)$$

for each i, where $b_i$ may represent the $i^{th}$ bit in received vector 114. A LLR for each bit that is greater than zero may indicate that a bit value of zero is more likely, while a LLR that is less than zero may indicate that a one bit value of one is more likely. LDPC decoder 116 may use the computed LLR messages in the message passing algorithm. When utilizing such an iterative algorithm, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. For maintenance of throughput, LDPC decoder 116 may be equipped with a maximum iteration limit that is any suitable predetermined number. When LDPC decoder 116 reaches the maximum iteration limit, (i.e., a positive integer, maxIterNum), LDPC decoder 116 may automatically terminate operation and move on to the next received vector 114. However, if the output of LDPC decoder 116 successfully converges to a valid codeword, LDPC decoder 116 may then output decoded information 118.

Figure 2:
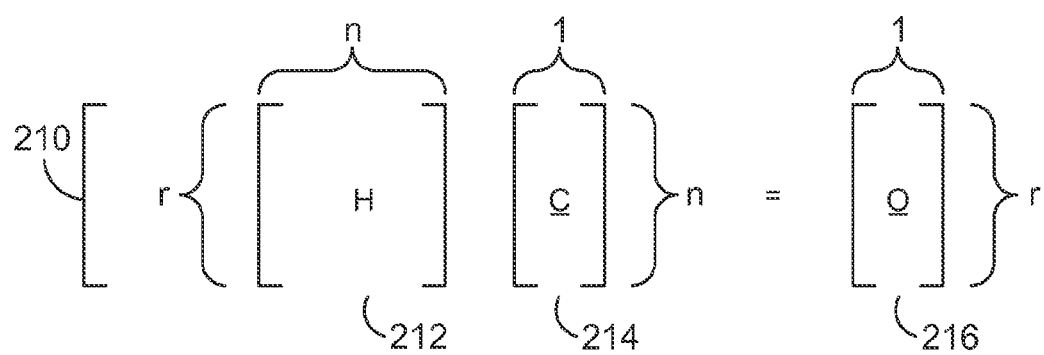
FIG. 2 shows an illustrative example of the properties of a codeword in accordance with some embodiments.

FIG. 2 shows an illustrative example of the properties of codeword 106 of FIG. 1 in accordance with some embodiments. The LDPC codes processed by encoder 104 of FIG. 1 and LDPC decoder 116 of FIG. 1 are conventionally represented by mathematical vector models. In particular, an LDPC code is described by its parity check matrix H. Equation 210 illustrates parity check matrix 212. Parity check matrix 212 is of size [r×n], corresponding to codewords of length n and syndromes of length r. Codewords may be, for example, n-length codeword 106 or n-length received vector 114 of FIG. 1. Syndrome length r satisfies the inequality r≧n−k and where k is the length of the information being encoded (e.g., length of user information 102 of FIG. 1). Each bit of codeword 114 corresponds to a column of parity check matrix 212. When parity check matrix 212 is multiplied by codeword 214, the result is syndrome 216. Syndrome 216 is a zero-vector of size [r×1] where all elements equal zero. When syndrome 216 is equal to a zero-vector, codeword 214 is determined to be a valid codeword. When syndrome 216 is not equal to a zero-vector, codeword 214 is determined to be an invalid codeword. Parity check matrix 212 is not unique, and may be chosen, for example, to be computationally convenient and/or to decrease the number of errors generated by the message passing algorithm in LDPC decoder 116. As discussed in relation to FIG. 1, codeword 214 may be decoded in LDPC decoder 116 to produce decoded information 118.

Figure 3:
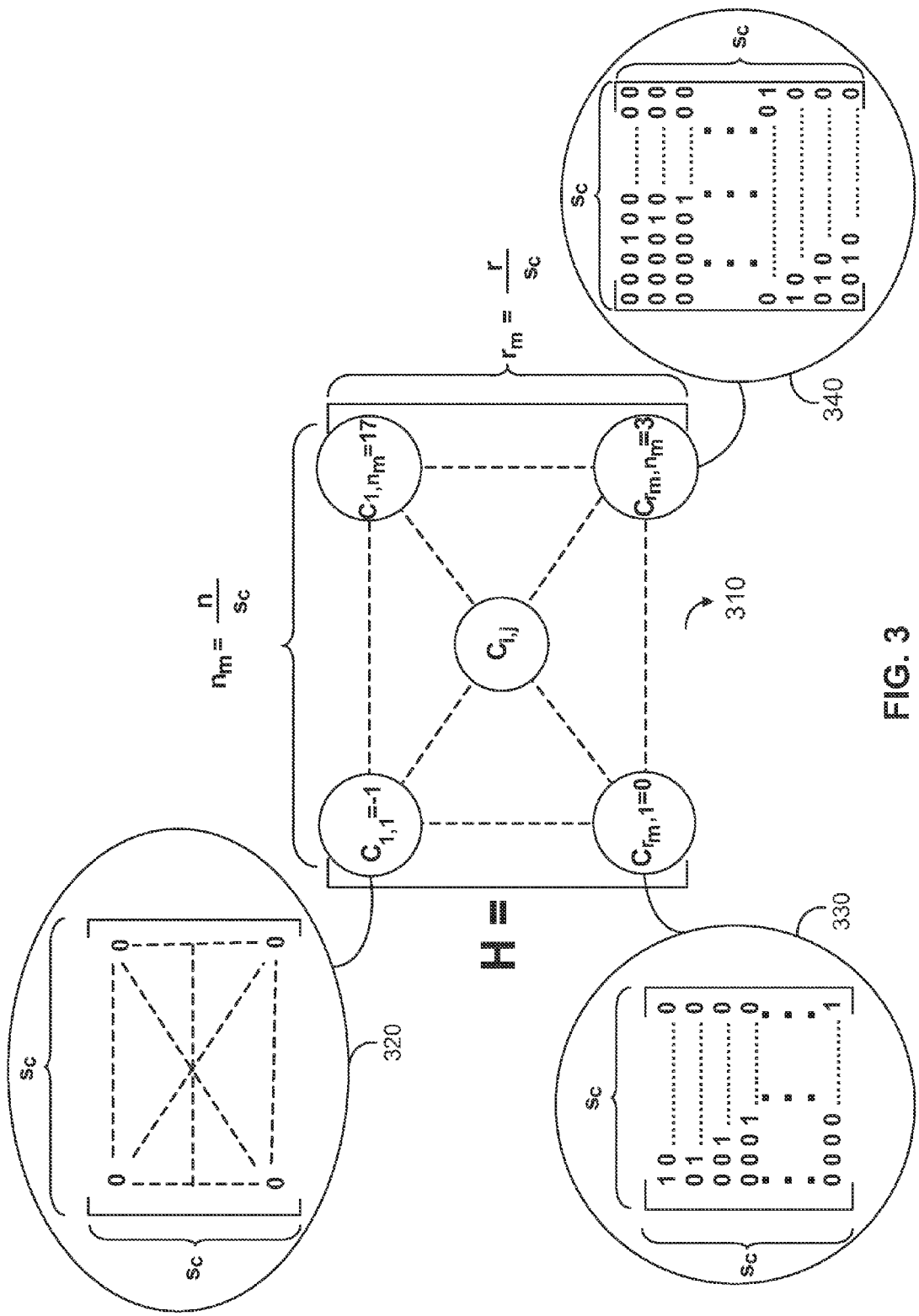
FIG. 3 shows an illustrative example of a quasi-cyclic parity check matrix in a mother matrix representation in accordance with some embodiments.

FIG. 3 shows an illustrative example of quasi-cyclic parity check matrix 310 in a mother matrix representation in accordance with some embodiments. A mother matrix representation is a compact way for describing a matrix that may contain a large number of elements. The mother matrix representation is equivalent to the normal matrix representation, but may be advantageous in illustrating the structure of a possibly large matrix without the necessity of explicitly listing each element in the matrix.

A quasi-cyclic code representation is defined by the characteristic that the parity check matrix for that particular code is quasi-cyclic. A quasi-cyclic parity check matrix in a mother matrix representation is made up of circular submatrices known as circulants. Circulant 340 is one such matrix. Circulant 340 is a square matrix—i.e., circulant 340 has the same number of rows as columns. This number is commonly referred to as the circulant size $S_c$. In addition, circulants have the property that for any given positive integer $C_{i,j} < S_c$, any row/column of the circulant matrix may be cyclically shifted by $C_{i,j}$ positions to obtain another row/column. For example, the number zero represents identity matrix 330 of size $S_c$. The number three represents matrix 340 that is equal to identity matrix 330 with each row cyclically shifted to the right by three positions. As a matter of notation, minus-one denotes the all-zero matrix 320. For brevity, the phrase "non-zero circulant" will be used to refer any circulant matrix that is not the all-zero matrix. Recall that parity check matrix 310 is of size [r×n]. Thus, the size of the mother matrix is $[r_m = r/S_c \times n_m = n/S_c]$, where $S_c$, r, and n are chosen so that $r_m$ and $n_m$ are integers. FIG. 3 also shows how $n/S_c$ of the circulants of parity check matrix 310 along a row can be grouped to form a block row. Parity check matrix 310 can therefore be partitioned into $r/S_c$ block rows each of size $[S_c \times n]$. Similarly, $r/S_c$ of the circulants of parity check matrix 310 along a column can be grouped to form a block column. Parity check matrix 310 can therefore be partitioned into $n/S_c$ block columns each of size $[S_c \times r]$.

Figure 4:
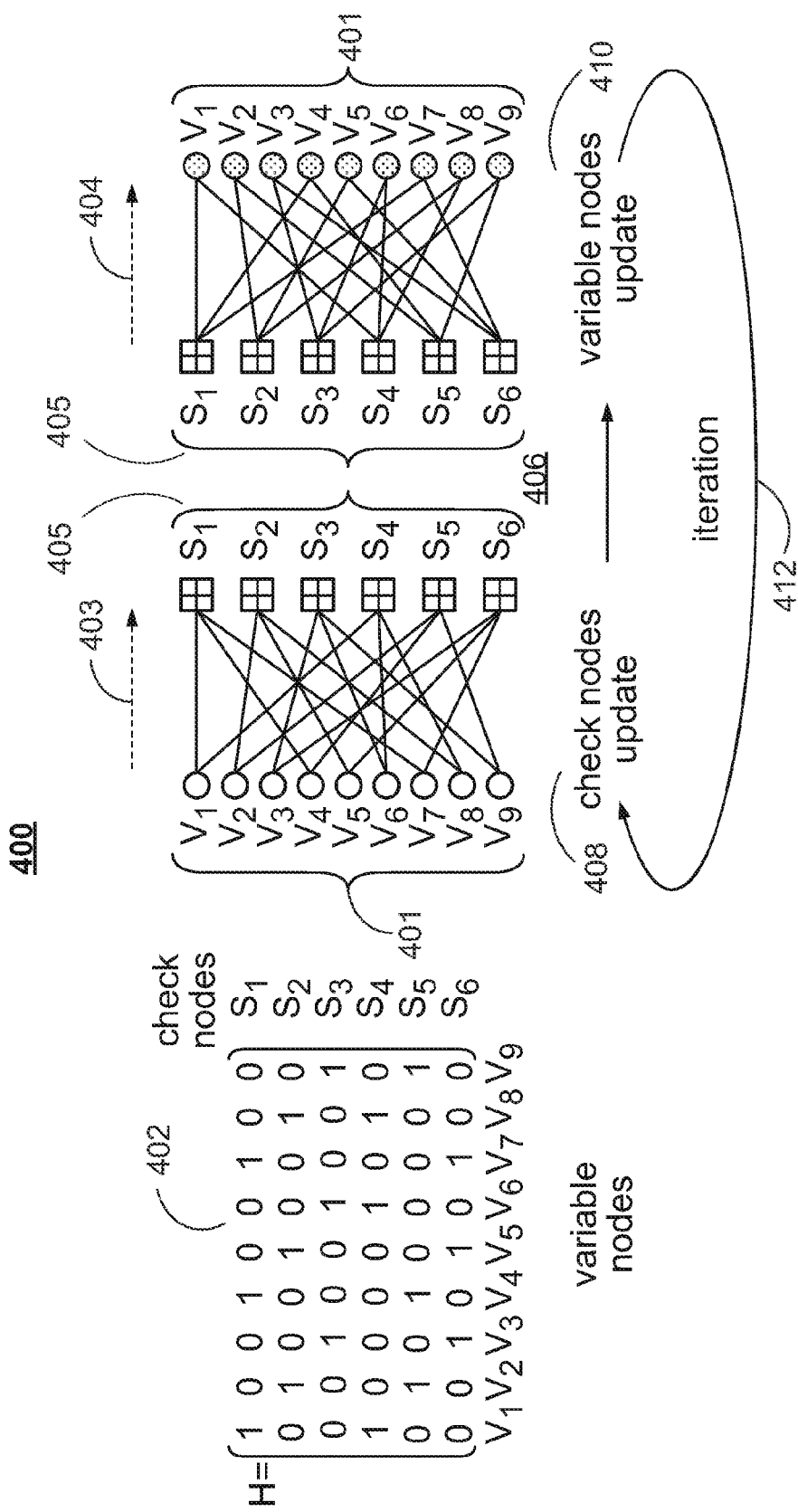
FIG. 4 shows a graphical illustration of a parity check matrix and the iterative message passing algorithm implemented in an LDPC decoder in accordance with some embodiments.

FIG. 4 shows graphical illustration 400 of a parity check matrix and the iterative message passing algorithm implemented in an LDPC decoder in accordance with some embodiments. An LDPC code may be graphically represented by a Tanner graph, a bipartite graph showing the relationship between an LDPC code's codeword bits and parity check equations. The advantages of using a Tanner graph of an LDPC code may include access to efficient graph-based message-passing algorithms for decoding. There are two types of nodes shown in Tanner graphs 403 and 404. Variable nodes 401 represent each position in codeword 106 and are denoted by circles. Thus, there may be n variable nodes. Variable nodes may also be referred to as symbol or bit nodes. Check nodes 405 may represent each syndrome (parity check equation) of LDPC code. For example, there may be n−k check nodes. Check nodes are denoted by squares.

Tanner graphs 403 and 404 correspond to parity check matrix 402. The check nodes and variable nodes of Tanner graphs 403 and 404 correspond to the rows and columns of parity check matrix 402, respectively. The undirected edges connecting check nodes with variable nodes correspond to the locations of the non-zero entries of parity check matrix 402. In other words, parity check matrix 402 is the adjacency matrix of Tanner graphs 403 and 404. For example, the 1 at the (1,1) location and the 0 at the (1,2) location of parity check matrix 402 may indicate that there is an edge between check node $S_1$ and variable node $V_1$, and that there is no edge between check node $S_1$ and variable node $V_2$, respectively.

The check nodes (e.g., check nodes 405) of a Tanner graph may either be satisfied or unsatisfied, where a satisfied node has a binary value of 0 and an unsatisfied node has a binary value of 1. The value of each check node may be equal to the sum modulo two of the values of the variable nodes to which it is connected. A check node is satisfied (i.e., equal to 0), if the values of the variable nodes connected to the check node sum to an even number and otherwise it is unsatisfied. For example, check node $S_2$ of Tanner graphs 403 and 404 may be satisfied if the values of variable nodes $V_2$, $V_5$, and $V_8$ sum to an even number. Furthermore, when a check node is unsatisfied and the values of the variable nodes to which it is connected do not sum to zero, at least one of the variable nodes connected to it may be in error. Thus, the value of the check nodes (or equivalently, the value of the syndrome produced by parity check matrix 402) may provide a parity check on each codeword received by an LDPC decoder (i.e., LDPC decoder 116 of FIG. 1), thereby providing error correction capability to communication/storage system 100 of FIG. 1.

Tanner graphs 403 and 404 may be used to illustrate an iterative two-step decoding algorithm known as message passing algorithm 406. Message passing algorithm 406 may be employed by, LDPC decoder 116 of FIG. 1 or any variant of this decoder (e.g., a flooding decoder, or a layered decoder). The message passing algorithm performs several rounds (or iterations) of message updates in accordance with the structure of the Tanner graph associated with the parity check matrix of the LDPC codes to be decoded.

The update steps in message passing algorithm 406, can be scheduled in multiple ways. For example, each iteration 412 of message passing algorithm 406 may include processing several check nodes. Iteration 412 may be repeated until either the codeword has been decoded or until a threshold number of iterations has been reached. The messages that are sent during each step of each iteration of message passing algorithm 406 may depend on the update rules and the scheduling of the update steps.

Prior to the first iteration of message passing algorithm 406, each of the variable nodes 401 of FIG. 4 receives an initial LLR message based on information derived from received vector 114 in FIG. 1. As will be discussed below, a low power syndrome check may be performed, in some cases, prior to or during the first iteration of message passing algorithm 406.

In some embodiments, a layered approach may be used to decode an LPDC code. This approach may involve updating groups of variable nodes or groups of check nodes in parallel. To accomplish this, check nodes associated with a particular row in an LDPC code's parity check matrix, in a mother matrix representation, may be grouped together. For example, check nodes associated with the first four rows of a parity check matrix may be combined into one group of check nodes and may be updated at substantially the same time, i.e., processed in parallel and, for example, in the first layer of decoding. In some embodiments, check nodes associated with the first block row of the parity check matrix (i.e., the first n rows of the parity check matrix, where n is a positive integer) may be processed in the first layer of decoding. In other embodiments, check nodes associated with a portion of the first block row of the parity check matrix may be processed in the first layer of decoding. Similarly, variable nodes associated with a particular column (block column) of the parity check matrix, in a mother matrix representation, may be grouped and processed together.

Processing for and updating of all check nodes in a group of check nodes may be done in parallel. Similarly, processing for and updating of all variable nodes in a group of variable nodes may also be done in parallel.

Figure 5:
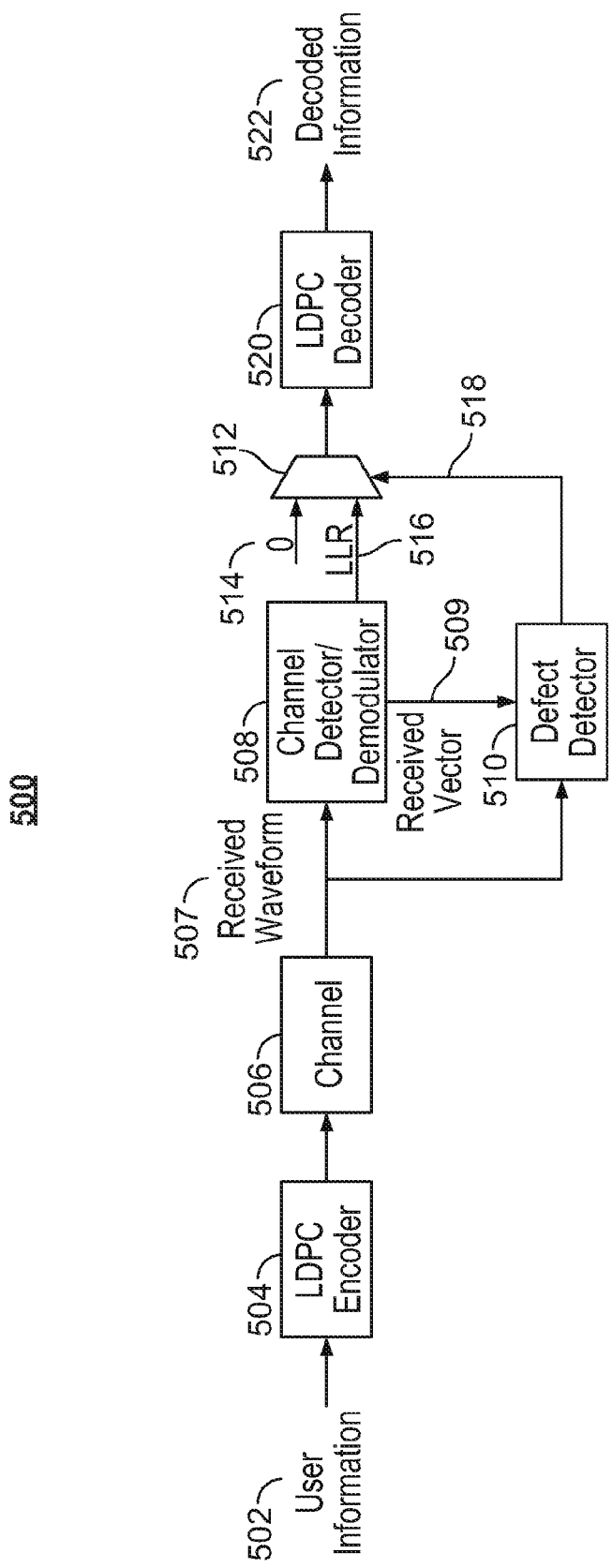
FIG. 5 shows an illustrative block diagram of an error-correcting communication/storage system 500 with defect detector circuitry in accordance with some embodiments.

FIG. 5 shows an illustrative block diagram of an error-correcting communication/storage system 500 with defect detector circuitry in accordance with some embodiments. System 500 includes LDPC encoder 504, channel 506, channel detector/demodulator 508, defect detector 510, multiplexer 512, and LDPC decoder 520. Multiplexer 512 includes a select input 518, as well as two data inputs 514 and 516.

Encoder 504 encodes user information 502 using, for example, a low density parity check (LDPC) code (e.g., in a way that is similar to encoder 102 in FIG. 1). The result of encoding user information 502 is a codeword (not shown) that may be passed to a modulator (not shown) to prepare the codeword for transmission on channel 506. Channel 506 represents media through which the information-carrying signals travel and may be similar to channel 110 in FIG. 1.

Due to interference signals and other types of noise and phenomena, channel 506 may corrupt waveform 507. Waveform 507, received by channel detector/demodulator 508, may therefore be different from the originally transmitted signal waveform. Received waveform 507 may be detected and/or demodulated with channel detector/demodulator 508. For example, channel detector/demodulator 508 may detect and demodulate received waveform 507 with filters, multiplication by periodic functions, or any suitable detection or demodulation technique corresponding to the type of modulation used in the transmission. The result of detection/demodulation is received vector 509 and this result may contain errors due to channel corruption (e.g., similarly to received vector 114 of FIG. 1).

In some embodiments, bits of the received vector 509 may be detected as defect bits, i.e., bits with a low reliability value that are identified as potential error bits. As used herein, a reliability value is an absolute value of the LLR message associated with the bit of the corresponding received vector. LDPC decoder 520 may make use of a defect detector to decode received vector 509 (to output decoded information 522).

In some embodiments, bits of the codeword may be punctured (i.e., erased). Puncturing may be purposefully performed by an encoder to change the data rate of the code. For example, puncturing may allow to increase the code rate from ½ (i.e., a codeword in which one half of the bits are information bits, and the other half of the bits are parity bits) to ⅔ (i.e., a codeword with one half as many parity bits as information bits). The punctured codeword is then transmitted through channel 506. During the decoding of received vector 509 (e.g., in LDPC decoder 520), punctured bits may be reconstructed. In this case, LDPC decoder 520 may know which bits of the codeword were punctured and use that knowledge to decode received vector 509.

Defect detector 510 receives information from channel 506 and channel detector/demodulator 508. For example, received waveform 507 and received vector 509 may be input to defect detector 510. Defect detector 510 may then detect defect bits in received vector 509 based on received waveform 507. For example, defect bits may correspond to a low reliability value. Defect bits may not necessarily be error bits, but instead may correspond to potential error bits.

In some embodiments, channel detector 508 may compute a reliability value for the bits of received waveform 507. For example, channel detector/demodulator 508 may compute an initial LLR message using the equation $$LLR(b_i) = \log\left(\frac{P(b_i = 0)}{P(b_i = 1)}\right)$$

for each i, where $b_i$ may represent the $i^{th}$ bit in received vector 509. Defect detector 510 may receive these initial LLR messages from channel detector/demodulator 508, and compute a reliability value Reliab(LLR($b_i$)) that is equal to the absolute value of the initial LLR message abs(LLR($b_i$)) for each bit $b_i$ in received vector 509. If the computed reliability value Reliab(LLR($b_i$)) is above a certain threshold, Thr, defect detector 510 may determine that the associated bit $b_i$ is a high reliability bit. Alternatively, if the calculated reliability is less than or equal to Thr, defect detector 510 may determine that the associated bit $b_i$ is a low reliability bit.

One particular type of error that can occur during transmission in the communications channel is called burst error. Burst error patterns are commonly found in, for example, magnetic recording channels (e.g., hard drives). In some embodiments, defect detector 510 may perform burst error pattern detection. To achieve this, defect detector 510 may compute the sum of absolute values of initial LLR messages for a sequence of w bits in received vector 509 (i.e., a window of size w). For example, defect detector 510 may compute a window reliability value $$\frac{1}{w}\sum_{i=s}^{s+w} \text{abs}(LLR(b_i))$$

for each value, s, for the start of the window of w bits, i.e., for s=0, 1, ..., $N_{bits}$ where $N_{bits}$ is the total number of bits in received vector 509. For each one of these values of s, defect detector 510 may determine whether the window reliability value $$\frac{1}{w}\sum_{i=s}^{s+w} \text{abs}(LLR(b_i))$$

exceeds a threshold Thr. If the window reliability value does not exceed Thr, the bits in the window of size w bits are detected as defect bits (i.e., a burst error pattern is detected). A burst error pattern detector was discussed in, for example, commonly-assigned patent application Ser. No. 11/821,231, filed Jun. 21, 2007, which is incorporated by reference herein in its entirety. However, it is understood that defect detector 510 may be any detector that is suitable to detect defect bits in the received vector 509 and/or channel 506. It is also understood that defect detector 510 and multiplexer 512 can be inside or outside LDPC decoder 520, or can be a part of any component of LDPC decoder 520.

If defect detector 510 detects a defect bit in received vector 509, then select input 518 of multiplexer 512 may, e.g., be set to one. If the select input 518 of multiplexer 512 is set to one, then input 514 is selected. The result of this is that the LLR message associated with the defect bit in received vector 509 is set to zero (i.e., the bit is erased).

Alternatively, if defect detector 510 determines that a bit in received vector 509 is not a defect bit, then select input 518 of multiplexer 512 may, e.g., be set to zero. If the select input 518 of multiplexer 512 is set to zero, then input 516 is selected and the initial LLR message associated with the bit may be transmitted from channel detector/demodulator 508 to LDPC decoder 520.

LDPC decoder 520 receives the LLR messages output by multiplexer 512, i.e., the LLR messages corresponding to received vector 509 that have been transmitted from channel detector/demodulator 508 through data input 516, as well as the LLR messages that have been erased by transmitting zero LLR messages through data input 514. LDPC decoder 520 may then use these LLR messages to assign priorities to bits in received vector 509. As noted earlier, the absolute value of the LLR message associated with a bit in received vector 509 may correspond to a reliability value for that bit. The assigned priorities may subsequently be used to determine an order for processing these bits inside LDPC decoder 520 to decode received vector 509. This will be discussed in greater detail, below, with reference to FIGS. 6-12.

Figure 6A:
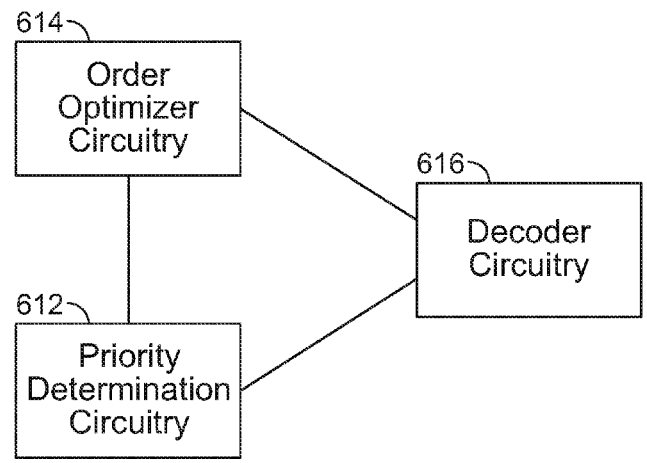
FIG. 6A shows a simplified block diagram of components of a decoder with priority determination and order optimizer circuitry in accordance with some embodiments.

FIG. 6A shows a simplified block diagram of components of a decoder (e.g., LDPC decoder 116 of FIG. 1, or LDPC decoder 520 of FIG. 5) with priority determination and order optimizer circuitry in accordance with some embodiments. Decoder 610 includes priority determination circuitry 612, order optimizer circuitry 614, and decoder circuitry 616 that can be used to decode a received vector (e.g., received vector 104 of FIG. 1, or received vector 509 of FIG. 5).

Priority determination circuitry 612 receives information associated with the received vector (e.g., LLR messages) and assigns a priority for a group of bits in the received vector. For example, priority determination circuitry 612 may assign a high priority (equivalently, a top priority) to bits with a low reliability value. As described above, a reliability value may correspond to the absolute value of the LLR message associated with the bit in the received vector. In some embodiments, priority determination circuitry 612 may assign a high priority to all punctured bits of the received vector. Recall that punctured bits are bits that may have been removed from a codeword before transmitting it through a channel. In some embodiments, priority determination circuitry 612 may assign a high priority to all detected defect bits and erased bits of the received vector. In some embodiments, priority determination circuitry 612 may assign a high priority to all bits of the received vector.

Order optimizer circuitry 614 receives the priority assignments determined by priority determination circuitry 612, and determines an order in which to process each bit with an assigned priority in the received vector. In some embodiments, decoder 610 may operate using a layered approach to decoding. As explained above, this approach may involve updating, in parallel, groups of variable nodes or groups of check nodes. To accomplish this, check nodes associated with a particular row in an LDPC code's parity check matrix, in a mother matrix representation, may be grouped together. In some embodiments, each block row of the parity check matrix may correspond both to grouped check nodes as well as a layer to be processed during layered decoding. For example, during one clock cycle of layered decoding, one block row of the parity check matrix may be processed. High priority bits are associated with block columns in the parity check matrix, in a mother matrix representation, of the LDPC code being applied. A high priority may be assigned to a block column (i.e., making it a high priority block column) based on the number of high priority bits of the received vector that are associated with that block column. Non-zero circulants (e.g., similar to circulant 340 of FIG. 3) that are located within and correspond to a high priority block column of the parity check matrix in a mother matrix representation are called high priority circulants. During layered decoding, high priority circulants located within and associated with a layer are processed when that layer is processed.

In some embodiments, e.g., when decoder 610 operates using a layered approach to decoding, order optimizer circuitry 614 may include a layer order optimizer configured to determine a suitable layer processing order for the high priority bits in the received vector. For example, order optimizer circuitry 614 may output a set of layers to process first in decoder circuitry 616.

Decoder circuitry 616 receives the processing order of bits in the received vector as determined by order optimizer circuitry 614, and processes the received vector based on that order. For example, decoder circuitry 616 may process layers in the order provided by layer order optimizer circuitry 614.

It should be understood that order optimizer circuitry 614, and priority determination circuitry 612 can be inside or outside decoder 610, or can be a part of any component of decoder 610.

Figure 6B:
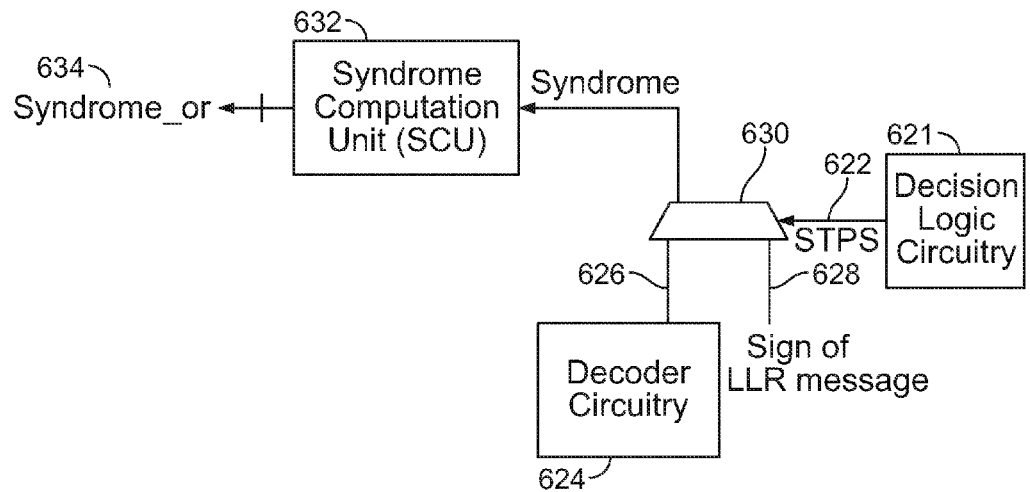
FIG. 6B shows a simplified block diagram of a decoder with low power circuitry in accordance with some embodiments.

FIG. 6B shows a simplified block diagram of an LDPC decoder 620 (e.g., similar to LDPC decoder 116 of FIG. 1, or LDPC decoder 520 of FIG. 5) with low power circuitry in accordance with some embodiments. LDPC decoder 620 includes decision logic circuitry 621, syndrome computation unit 632, multiplexer 630, and decoder circuitry 624 that may be used to decode a received vector. Multiplexer 630 includes Switch-To-Power Save (STPS) select input 622, as well as data inputs 626 and 628.

A low power syndrome check of a received vector may be performed by computing a syndrome (e.g., syndrome 216 of FIG. 2). If the computed syndrome is equal to a zero-vector, the received vector is determined to be a valid codeword, and no additional processing may be needed. If, instead, the computed syndrome is not equal to a zero-vector, the received vector is determined to be an invalid codeword, and may be processed further. During the process of decoding the received vector in decoder 620, multiplexer 630 allows for a choice between performing a low power syndrome check or decoding without a low power syndrome check. The low power syndrome check may allow the decoder to quickly determine if the received vector is a valid codeword. A power savings may therefore be realized by the decoder from not having to process/decode the received vector any further. For example, if a reliability value (i.e., the absolute value of the LLR message) for each high priority bit in the received vector (e.g., as assigned by priority determination circuitry 612) is determined to be lower than a certain threshold, ThrReliability, decision logic circuitry 621 may set STPS select input to e.g., one, and the low power syndrome check may be disabled. If, however, the reliability value for at least a certain percentage of high priority bits in the received vector is determined to be higher than ThrReliability, decision logic circuitry 621 may set STPS select input to, e.g., zero, and the low power syndrome check may be enabled. A power savings may be realized in the decoder as a result of the low power syndrome check being enabled.

Multiplexer 630 includes STPS select input 622, as well as inputs 628 and 626. STPS select input 622 allows multiplexer 630 to choose either input 628 or input 626 to be output to syndrome computation unit 632.

If STPS select input 622 of multiplexer 630 is equal to, e.g., one, then the low power syndrome check is enabled. Multiplexer 630 then chooses input 628 (the sign of the initial LLR message or sign of the latest LLR message computed by the decoder) to be passed to syndrome computation unit 632. STPS select input 622 may be used to substantially stop further processing of the received vector by decoder circuitry 624, e.g., when it is set to one and when the low power syndrome check is enabled. When the low power syndrome check is enabled, decoder 620 does not perform normal decoding of the received vector (e.g., full-blown decoding in decoder circuitry 624 that may, for example, operate using a layered approach and involve reading and writing from and to decoder memories). Because normal LDPC decoder processing is not performed at that time, power consumption from decoder components that would otherwise be used during normal processing may be minimized. Therefore, the overall power consumption of a device in which the decoder is located or used may be substantially reduced.

If STPS select input 622 of multiplexer 630 is equal to, e.g., zero, then the low power syndrome check is disabled. Multiplexer 630 then chooses input 626 (the output of decoder circuitry 624) to be passed to syndrome computation unit 632. When the low power syndrome check is disabled, normal LDPC decoder processing of the received vector is performed. Normal decoder processing may, for example, be performed if the low power syndrome check does not determine that the received vector is a valid codeword.

During normal processing, low power syndrome check is disabled and STPS select input 622 of multiplexer 630 is set to, e.g., zero. Syndrome computation unit 632 computes a syndrome (e.g., syndrome 216 of FIG. 2) based on the messages it receives at its input and the parity check matrix associated with the LDPC code being applied. The convergence logic may determine that the received vector is valid based on the syndromes it receives. For example, if the syndromes are all zero, then the convergence logic may determine that the received vector is a valid codeword and may terminate any further processing of the received vector by LDPC decoder 620. If, however, any one syndrome is non-zero, then the convergence logic may determine that the received vector is an invalid codeword and may allow further processing of the received vector by LDPC decoder 620 (i.e., additional iterations). This process may be repeated for each circulant (equivalently each block or sector) in each layer of the parity check matrix, and iterated after all of the layers of the parity check matrix have been processed. The iterations may continue until the LDPC decoder converges to a valid codeword or until the maximum iteration limit (i.e., a positive integer, maxIterNum) is reached, whichever comes first.

During low power decoder processing (i.e., with the low power syndrome check enabled), STPS select input 622 of multiplexer 630 is equal to, e.g., one. As discussed above, initial LLR messages, based on information from the received vector, are computed or received by the LDPC decoder (for example, from a channel detector like channel detector/demodulator 508 of FIG. 5). The sign of the initial LLR message for each bit of the received vector may be computed. For example, the sign may be equal to zero if the initial LLR message for the $i^{th}$ bit in the received vector indicates that the probability of this $i^{th}$ bit being "0" is greater than or equal to the probability of it being "1." For example, the sign may be equal to one if the initial LLR message for the $i^{th}$ bit in the received vector indicates that the probability of this $i^{th}$ bit being "1" is greater than the probability of it being "0." In some embodiments, input 628 to multiplexer 630 is the sign of the initial LLR message for each bit in the received vector. In other embodiments, input 628 to multiplexer 630 is the sign of the latest LLR message value computed by the LDPC decoder circuitry 624, for each bit in the received vector. Since STPS select input 622 is equal to, e.g., one, the sign of the LLR messages 628 is chosen by multiplexer 630 to be passed to syndrome computation unit 632. Any other processing of the received vector may not be performed.

Syndrome computation unit 632 computes syndromes 634 based on the sign of the LLR messages that it receives at its input and the parity check matrix (e.g., parity check matrix 212 of FIG. 2) associated with the LDPC code being applied. Convergence logic may receive the computed syndromes from syndrome computation unit 632 and may determine that the received vector is valid based on these syndromes. For example, if the syndromes calculated are all zero, then the convergence logic may determine that the received vector is a valid codeword and may terminate any further processing of the received vector by LDPC decoder 620. If, however, the sign of any one syndrome calculated based on the LLR messages is non-zero, then the convergence logic may determine that the received vector is an invalid codeword and may allow further processing (normal decoder processing, described above) of the received vector by decoder circuitry 624. During layered decoding, the convergence logic may determine that the received vector is invalid after processing any layer associated with a non-zero syndrome. The low power syndrome check may then be stopped and decoder circuitry 624 may continue with normal decoder processing, described above.

While the foregoing describes the use of an LDPC decoder, this element may be replaced by any type of decoder (e.g., the LDPC decoder could instead or more particularly be any type of layered decoder, any type of flooding decoder, or any other type of decoder). The decoder may also be any variant of these decoders (e.g., a hard decoder, a bit-flipping decoder, a soft decoder, or any other variant of a decoder). Additionally, the decoder may make use of either hard information or soft information to decode incoming information.

Figure 7:
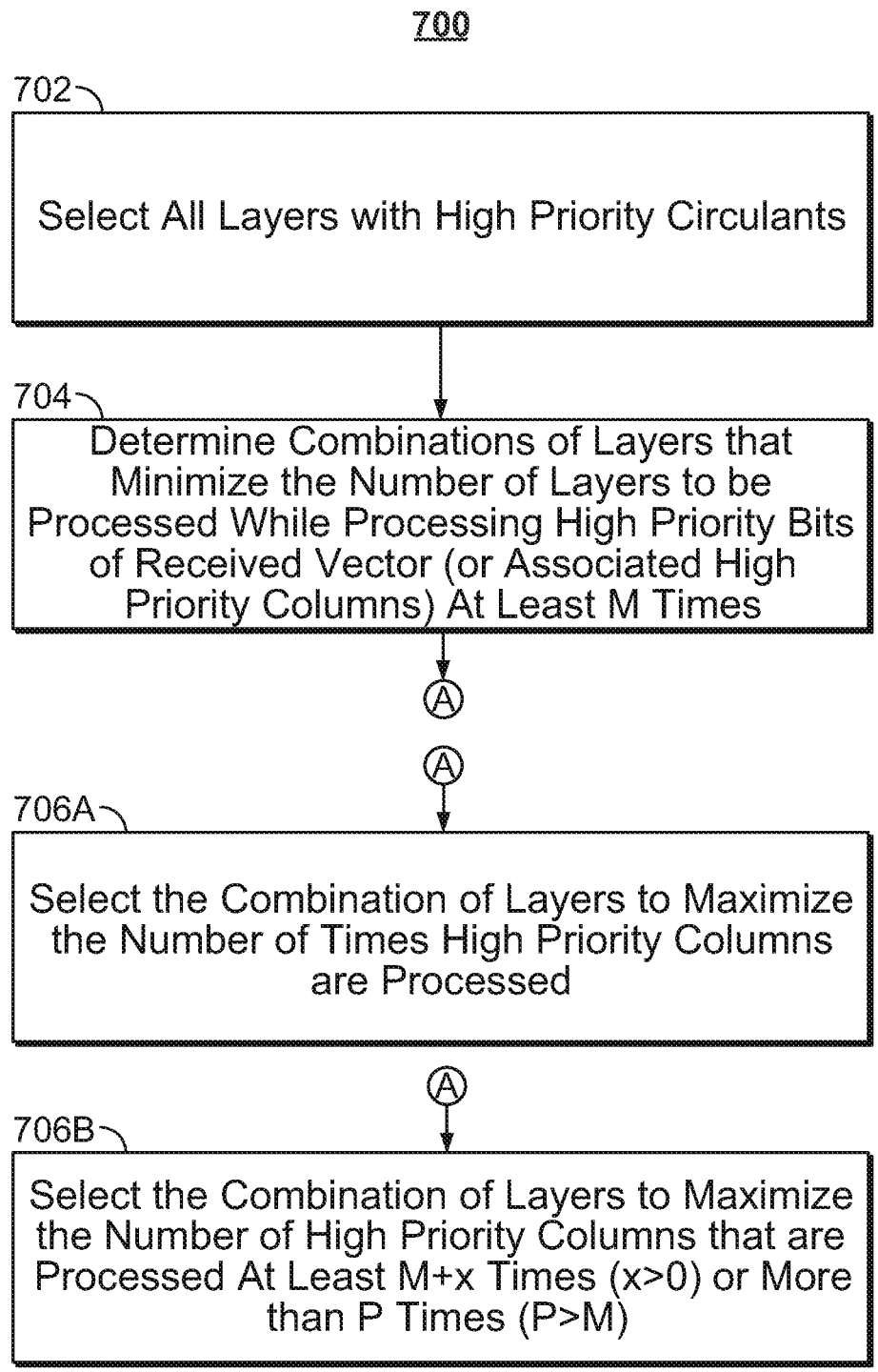
FIG. 7 shows a flowchart of a process for selecting a processing order for bits in a received vector in a layered approach in accordance with some embodiments.

FIG. 7 shows a flowchart of process 700 for selecting a processing order of bits in a received vector with known or unknown defects, erasures, and/or punctured bits (e.g., received vector 114 of FIG. 1, or received vector 509 of FIG. 5) in accordance with some embodiments. Process 700 may be implemented by layer order optimizer circuitry (e.g., order optimizer circuitry 614 of FIG. 6). For example, process 700 may be executed by a decoder that uses a layered approach to decoding (e.g., a layered LDPC decoder) to substantially reduce power consumption. Process 700 includes 702, 704, 706a, and 706b.

As used herein, a decoding layer refers to updating, in parallel, groups of check nodes and check variables. To accomplish this, check nodes associated with non-zero circulants (e.g., similar to circulant 340 of FIG. 3) in a particular row in a mother matrix representation (MM) of an LDPC code's parity check matrix may be processed together. In some embodiments, a block row of the MM may correspond both to grouped check nodes as well as a layer to be processed during layered decoding. For example, during one clock cycle of layered decoding, non-zero circulants of one block row of the MM are processed. High priority circulants correspond to non-zero circulants in the MM that have been assigned a high priority, for example by priority determination circuitry 612 of FIG. 6A. In some embodiments, these high priority circulants may correspond to high priority bits in the received vector that may have been punctured, erased, or detected as defects (e.g., by defect detector 510 of FIG. 5). In some embodiments, all non-zero circulants may correspond to high priority circulants. These high priority circulants are located within and may correspond to high priority block columns of the MM associated with the LDPC code being applied.

At 702, all layers associated with a parity check matrix that contain at least one high priority circulant are selected.

At 704, combinations of layers from the ones selected at 702 are determined. High priority circulants may be combined in distinct sets of layers to be processed, called solution sets. Each solution set is a combination of layers to be processed, that is chosen to minimize the number of layers in the set while ensuring the processing of each high priority block column at least M times (where M is a positive integer). Next, either 706a or 706b may be executed.

At 706a, a solution is selected from the solution sets determined at 704 to maximize the number of times all high priority block columns are processed. Specifically, a solution is selected from the solution sets to maximize the sum $$\sum_{J=1}^{K} M_J,$$

where K is the total number of high priority columns, and $M_J$ is the number of times high priority block column J is processed. Since the solution sets were determined at 704, any solution selected at 706a ensures that high priority block columns are processed at least M times.

Alternatively, 706b may be executed. Instead of maximizing the number of times each high priority block column is processed (i.e., as in 706a), a solution is selected at 706b that maximizes the number of block columns that are processed at least M+x times, or more than P times, where x and P are positive integers, and P is greater than M.

In some devices, performance (as measured, for example, by signal-to-noise ratio (SNR)) may degrade over the life of the device. For example, initial SNR may be high, reflecting good channel conditions and good data reliability, but as the device ages or is used more times, this SNR may degrade. A low power syndrome check (i.e., as described in FIG. 6B above) may be performed when high SNR is anticipated or expected, e.g., at the beginning of the life of the device. A syndrome may be computed based on the LDPC decoder input for the received vector using the same logic as in the LDPC decoder (i.e., by checking if the syndrome is zero and, therefore, the codeword is valid, or alternatively, if the syndrome is non-zero, and, therefore, an unsatisfied parity check is found, and the codeword is not valid). However, the low syndrome check may require significantly less power than an actual iteration of processing with normal (i.e., full-blown) LDPC decoding (e.g., as performed in decoder circuitry 624) because only the syndrome computation logic (convergence logic) may need to be active, and because hard decision values for the bits of the received vector (i.e., a "0" or a "1" value for each of the bits in the received vector as determined by, e.g., the decoder) may be used without the need to update LLR messages or read and write from and to decoder memory. The decoder may determine that the hard decision value of a bit in the received vector is "0" if the probability of the bit in the received vector being "0" is greater than or equal to the probability of it being "1." Otherwise, the hard decoder may determine that the hard decision value of the bit is "1," i.e., if the probability of the bit in the received vector being "1" is greater than the probability of it being "0"). As soon as the calculated syndrome indicates a non-zero value, the low power syndrome check may be disabled and normal (i.e., full-blown) LDPC decoding may be performed. Low power decoding circuitry was discussed in, for example, commonly-assigned patent application Ser. No. 12/892,183, filed Sep. 28, 2010, which is incorporated by reference herein in its entirety.

Performing a low power syndrome check on a received vector with errors, defects, erasures and/or punctured bits may require a different approach in order to maintain or improve the performance and power consumption of a decoder. This may be because there are no hard decision values for punctured/erased bits, since an erased/punctured bit does not correspond to an initial transmitted value, so computing a syndrome for erased or punctured bits in the received vector may be meaningless. In addition, computing a syndrome for defect bits may produce a non-zero syndrome, since the hard decision values associated with defect bits may be incorrect for at least some of these defect bits. In some embodiments, the processing order of bits may be combined with low power decoding (e.g., performing low power syndrome check as discussed in FIG. 6B). For example, low power decoding may be enabled and performed after processing a small number of layers that correspond to defect and/or punctured bits.

In some embodiments, the LLR messages associated with all error or defect bits in the received vector may be erased (i.e., these error or defect bits may be erased). The input to the decoder (e.g., LDPC decoder 520 of FIG. 5 or decoder 610 of FIG. 6A) may therefore only contain punctured/erased bits or correct bits, and no error bits. In this case, once each erased bit is processed at least M times, according to the processing order determined at 706a or 706b, decision logic circuitry (e.g., decision logic circuitry 621 of FIG. 6B) may determine to switch to low power decoding.

In some embodiments, the received vector may contain known error bits and/or detected defect bits, in addition to punctured bits. This may happen, for example, when some defect bits are detected as potential error bits, or for low reliability bits that are not erased. As described above, each error, defect, and/or punctured bit may be assigned a high priority, and each high priority bit may be processed at least M times in the processing order determined at 706a or 706b. In an embodiment, a first value, for example, a hard decision value may be computed for each high priority bit in the received vector after the bit is processed a first time (e.g., using a decoder). This first hard decision value is then compared to a second hard decision value computed for the same bit after it has been processed a second time. If no change is detected in the hard decision values for all, or a percentage of all, the high priority bits in the received vector, then low power decoding is enabled and performed. This approach may be generalized to compute an $M^{th}$ hard decision value for each high priority bit after the high priority bit is processed M times, and switch to low power decoding if no change in hard decision values is detected after the $P^{th}$ time that the high priority bits are processed (P>M).

In some embodiments, the received vector may contain unknown error bits and/or undetected defect bits. After processing the received vector according to the processing order determined at 706a or 706b, a first hard decision value is computed for each bit in the received vector. A second processing order may be determined (e.g., as described at 706a or 706b), and each bit in the received vector is then processed at least a second time. A second hard decision value is then computed for each one of the bits of the received vector. If no change is detected between the first and second hard decision values for all, or a percentage of all, bits of the received vector, then low power decoding is enabled and performed. Process 700 will be illustrated in greater detail in FIGS. 8A, 8B, and 9 below.

Figure 8B:
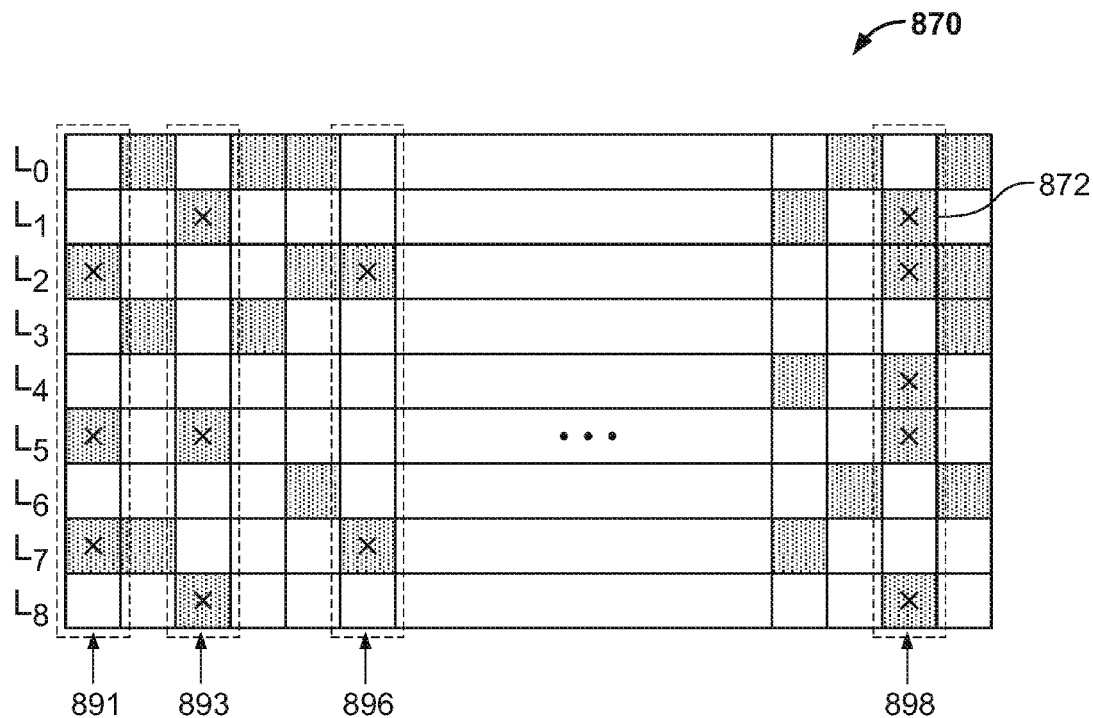
Figure 9:
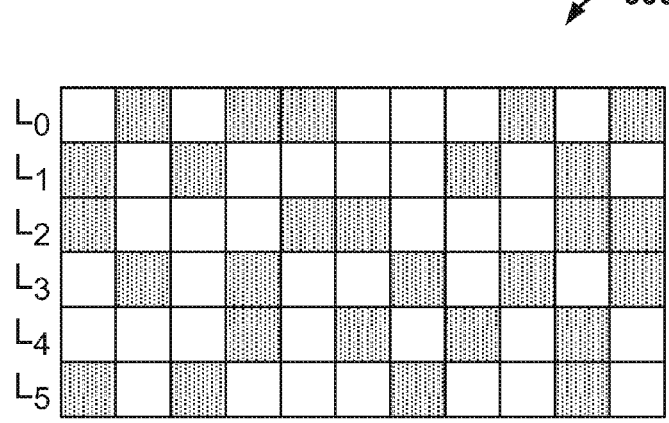
FIG. 9 shows a parity check matrix in a mother matrix representation that illustrates decoder processing of a received vector with undetected defects and/or unknown errors in accordance with some embodiments.

FIGS. 8A, 8B and 9 show illustrative examples of the processing of a parity check matrix in a mother matrix representation in accordance with some embodiments. The processing illustrated in FIGS. 8A and 8B may be used when the received vector contains known error bits and/or detected defect bits and/or bits that have been punctured (e.g., when flexible code rates are needed). The processing illustrated in FIG. 9 may be used when the received vector contains unknown error bits and/or defect bits that have not been detected.

FIG. 8A shows a parity check matrix in a mother matrix representation that illustrates decoder processing of a received vector with known defects and/or punctured bits in accordance with some embodiments. This processing may be performed in decoder circuitry (e.g., LDPC decoder 520 of FIG. 5, or decoder 610 of FIG. 6) when, for example, high priority bits (e.g., punctured and/or detected defect bits) in the received vector are associated with a few block columns of the parity check matrix (i.e., a few high priority block columns). This may be the case in the early life of some devices (e.g., SSDs or eMMC Flash devices) when there are few defects and/or errors, or when there are no errors but some punctured bits. The LLR messages corresponding to the defect bits may or may not have been erased (e.g., by defect detector 520 and multiplexer circuitry 512 of FIG. 5).

Parity check matrix 800 may have multiple block rows. For example, parity check matrix 800 has block rows 811-814. Each block row of parity check matrix 800 may directly correspond to a layer to be processed during layered decoding. For example, during the first clock cycle of layered decoding, block row 814 may be processed. The number of block rows processed in a layer may vary depending on the specific hardware implementation of block row processing in the decoder circuitry. In some embodiments, a layer may correspond to a portion of a block row, or to more than one block row, depending on the details of implementation of the decoder circuitry.

Each square within matrix 800 represents a circulant (e.g., a circulant similar to circulants 320, 330, or 340 of FIG. 3). A zero circulant (e.g., a circulant similar to circulant 320 of FIG. 3) is denoted by a white square, for example square 802. A non-zero circulant (e.g., a circulant similar to circulant 340 of FIG. 3) is denoted by a shaded square, for example square 804. Each of the block rows in matrix 800 may include both zero and non-zero circulants.

Parity check matrix 800 may have multiple block columns. For example, it may have block columns 821-823, and 828. Each block column may correspond to a set of bit locations in a received vector (e.g., received vector 114 of FIG. 1, or received vector 509 of FIG. 5). In some embodiments, priorities may be assigned to block columns based on the presence of punctured, defect and/or error bits in the corresponding received vector. For example, a high priority may be assigned to block columns that correspond to a set of bit locations in the received vector that contain punctured, defect, and/or error bits (i.e., high or top priority bits).

In the example illustrated in FIG. 8A, bits in the received vector that have been assigned a high priority correspond to and are concentrated in two block columns 823 and 828. Such concentration in a few block columns may occur when contiguous bits in the received vector are defective, for example, in the case that a burst error pattern occurs. However, it should be noted that the processing illustrated by FIG. 8A may also apply to cases where high priority bits are not contiguous.

In an embodiment, each layer containing a non-zero circulant located within a high priority block column (i.e., a high priority circulant) is processed. For example, layer 814 contains two high priority circulants, 806 and 808, that are located, respectively, within high priority block columns 823 and 828. Recall that high priority block columns of the LDPC code's parity check matrix are associated with high priority bits of the received vector that has been encoded with the LDPC code. Therefore, at the end of processing layer 814, all high priority circulants, and therefore all high priority block columns and all high priority bits are processed at least once.

FIG. 8B shows an illustrative example of decoder processing of a parity check matrix 870 in a mother matrix representation with 9 block rows ($L_0, L_1, L_2, L_3, L_4, L_5, L_6, L_7$, and $L_8$) in accordance with some embodiments. In this example, four block columns 891, 893, 896, and 898 of parity check matrix 870 have been assigned a high priority. This may be the case when all high priority bits in a received vector (e.g., punctured, defect, and/or erased bits of the received vector) are associated with block columns 891, 893, 896, and 898 of the parity check matrix corresponding to the LDPC code being applied. Each non-zero circulant located within these high priority block columns (called high priority circulant) is denoted by a square with an X. For example, square 872 denotes a high priority circulant.

In this illustrative example, each high priority block column may need to be processed at least once (i.e., M=1). In an embodiment, each layer containing at least one high priority circulant is selected (e.g., as described in 702 of FIG. 7). For example, layers $L_1, L_2, L_4, L_5, L_7$, and $L_8$ are selected because they each contain at least one high priority circulant. These layers may correspond, respectively, to block rows 2, 3, 5, 6, 8, and 9.

The selected layers containing high priority circulants (i.e., $L_1, L_2, L_4, L_5, L_7$, and $L_8$) are then combined into solution sets. Each solution set contains a combination of layers to be processed that minimizes the number of these layers while ensuring the processing of each high priority block column at least once (e.g., as described in 704 of FIG. 7, with M=1). In this example, there are six solution sets (a)-(f) each identifying two layers to be processed, as shown in Table 1. All other solutions that process each high priority block column at least once require processing more than two layers, and are therefore discarded. For example, solution set $L_1, L_4$, and $L_7$ would ensure the processing of each high priority block column at least once, but is discarded because it requires processing three layers.

TABLE 1

Solution sets for processing layers in reference with FIG. 8B in some embodiments.

| Solution Set | (a) | (b) | (c) | (d) | (e) | (f) |
|---|---|---|---|---|---|---|
| Layers | $L_1$ and $L_2$ | $L_1$ and $L_7$ | $L_2$ and $L_5$ | $L_2$ and $L_8$ | $L_5$ and $L_7$ | $L_7$ and $L_8$ |
| Number of Times Block | 1, 1, 1, 2 | 1, 1, 1, 1 | 2, 1, 1, 2 | 1, 1, 1, 2 | 2, 1, 1, 1 | 1, 1, 1, 1 |

TABLE 1-continued

Solution sets for processing layers in reference with FIG. 8B in some embodiments.

| Solution Set | (a) | (b) | (c) | (d) | (e) | (f) |
|---|---|---|---|---|---|---|
| Column is Processed Total Number of Times Block Columns are Processed | 5 | 4 | 6 | 5 | 5 | 4 |

The third row of Table 1 shows, for each solution set (a)-(f), a comma separated list of the number of times that high priority block columns 891, 893, 896, and 898 are processed, respectively (i.e., numbers $M_J$ for J=1, 2, 3, and 4). For example, the first entry "1, 1, 1, 2" in the third row of Table 1 indicates that solution set (a) processes each of high priority block columns 891, 893, and 896 exactly once, and high priority block column 898 exactly twice. The last row of Table 1 shows the sum of times all high priority block columns are processed for each solution set (a)-(f) (i.e., $$\sum_{J=1}^{K} M_J,$$

with K=4). For example, the first entry "5" in the last row of Table 1 indicates that solution set (a) ensures processing all high priority columns a total number of five times.

In some embodiments, the processing order is selected from the solution sets so that the total number of times that high priority block columns are processed is maximized (e.g., as described in 706a of FIG. 7). In this example, solution set (c), corresponding to layers $L_2$ and $L_5$, is selected because it ensures processing high priority block columns more than any other solution set (i.e., six times). In other words, selecting solution set (c) maximizes the sum $$\sum_{J=1}^{K} M_J,$$

where the total number of high priority columns K is equal to 4.

Alternatively, the processing order may be determined so that it maximizes the number of high priority block columns that are processed at least twice (e.g., as described in 706b of FIG. 7, with M=1 and x=1). As shown in the third row of Table 1, solution sets (b) and (f) process all four of the high priority block columns exactly once. Solution sets (a), (d) and (e) process one of the four high priority block columns twice. Solution set (c) processes two of the high priority columns exactly twice (columns 891 and 898). Therefore, solution set (c) is also the solution that maximizes the number of high priority block columns that are processed at least two times. In the example above, both selection criteria (e.g., 706a and 706b of FIG. 7) result in selecting the same processing order (solution set (c)). This may not always be the case.

In some embodiments, it may be advantageous to group punctured bits so that the number of associated block columns in the parity check matrix in a mother matrix representation (MM) is as small as possible. Such grouping may result in simplifying the selection of the processing order (e.g., of the order of layers to be processed in a layered decoder) because it may result in reducing the number of the processing steps, and therefore reducing the time needed to process each of the associated high priority columns in the MM at least once (or more generally, at least M times).

In some embodiments, switching to low power decoding may be performed after processing bits that have been assigned a high priority. In an embodiment, the input to the decoder may only contain punctured/erased or correct bits, i.e., no error bits. In this case, decision logic circuitry (e.g., decision logic circuitry 621 of FIG. 6) may determine to switch the decoder to low power decoding once each punctured/erased bit has been processed, e.g., at least once. For example, in parity check matrix 870, decision logic circuitry may determine to switch to low power decoding after processing layers $L_2$ and $L_5$ once, since processing $L_2$ and $L_5$ would ensure that all high priority columns (and therefore associated high priority bits) are processed once.

In some embodiments, the received vector may contain known error bits and/or detected defect bits, in addition to known punctured bits. In this case, each error, defect and/or punctured bit may be assigned a high priority, and each high priority bit may be processed at least M times. In an embodiment, a first hard decision value (i.e., a determined "0" or "1" value) for each high priority bit in the received vector may be computed after the bit is processed a first time (e.g., using the decoder). This first hard decision value is then compared to a second hard decision value computed for the same bit after it has been processed a second time. If no change is detected in the hard decision values for all or a subset of the high priority bits in the received vector, then low power decoding may be enabled and performed. For example, in parity check matrix 870, a first hard decision value is stored for each high priority bit after processing layers $L_2$ and $L_5$ (i.e., solution set (c)). The high priority columns of the parity check matrix in a mother matrix representation (and hence, the associated high priority bits of the received vector) are further processed according to a different set of layers, for example $L_1$ and $L_7$ (i.e., solution set (b)). This processing of the second set of layers would ensure that high priority bits are processed at least a second time. A second hard decision value is then computed based on this second processing. The first and second hard decision values are then compared; if no change is detected for all or a subset of high priority bits, low power decoding may be enabled and performed. In some embodiments, it may be possible to detect whether hard decision values have changed for high priority bits after the first processing, i.e., the processing of the first set of layers. For example, processing layers $L_2$ and $L_5$ would result in processing two of the high priority block columns, 891 and 898, two times. A first hard decision may, for example, be computed for the high priority bits associated with these block columns 891 and 898 after processing layer $L_2$. A second hard decision may similarly be computed for these high priority bits after processing layer $L_5$. A change in the computed hard decision values may thus be determined at the end of the processing of the first set of layers.

FIG. 9 shows a parity check matrix in a mother matrix representation that illustrates decoder processing of a received vector with undetected defects and/or unknown errors in accordance with some embodiments. As opposed to the approach illustrated in FIGS. 8A and 8B above, where punctured and/or defect bits in a received vector are known and/or detected, the approach illustrated in FIG. 9 may be used when there are undetected errors, defect bits and/or low reliability bits in the received vector.

In this illustrative example, matrix 900 has six block rows ($L_0$, $L_1$, $L_2$, $L_3$, $L_4$, and $L_5$) and 11 block columns. Because there are undetected defect and/or error bits, all bits in the received vector are assigned a high priority. As opposed to the examples in FIGS. 8A and 8B where some bits were given a high priority (e.g., punctured, defect, and/or error bits) and others were not, the approach illustrated in FIG. 9 ensures that each bit in the received vector (and associated block column in the parity check matrix) is updated at least once, because each bit in the received vector (and associated block column) is assigned a high priority.

Each block column in matrix 900 is therefore processed at least once (i.e., M=1). Since all block columns are uniformly assigned a high priority, all layers with non-zero circulants that are located within all block columns (i.e., $L_0$, $L_1$, $L_2$, $L_3$, $L_4$, and $L_5$) are first selected (e.g., as described in 702 of FIG. 7).

The selected layers are then combined into solution sets that minimize the number of layers to be processed while ensuring the processing of each high priority block column at least once (e.g., as described in 704 of FIG. 7, with M=1). In this case, there are two solution sets (a) and (b) each identifying three layers to be processed. This is shown in Table 2. All other solutions that process all block columns at least once require processing more than three layers, and are therefore discarded. Table 2 also shows, for each solution set (a) and (b), a comma separated list of the number of times that each one of the 11 high priority block columns is processed, respectively (i.e., numbers $M_J$ for J=1, 2, 3, ..., 11). Table 2 also shows the total number of times that all high priority block columns are processed for each solution set (i.e., $$\sum_{J=1}^{K} M_J,$$

with K=11).

TABLE 2

Solution sets for processing layers in reference with FIG. 9 in some embodiments.

| Solution Set | (a) | (b) |
| --- | --- | --- |
| Layers | $L_0$, $L_4$, $L_5$ | $L_1$, $L_2$, $L_3$ |
| Number of Times Block Column is Processed | 1, 1, 1, 2, 1, 1, 1, 1, 1, 2, 1 | 2, 1, 1, 1, 1, 1, 1, 1, 1, 2, 2 |
| Total Number of Times Block Columns are Processed | 13 | 14 |

In some embodiments, a processing order that maximizes the total number of times that high priority block columns are processed is determined (e.g., as described in 706a of FIG. 7). In this example, solution set (b), corresponding to layers $L_1$, $L_2$, and $L_3$ is the determined processing order because it ensures processing high priority block columns more than any other solution set (14 times). In other words, selecting solution set (b) maximizes the sum $$\sum_{J=1}^{K} M_J,$$

where the total number of high priority columns K is equal to 11.

Alternatively, the processing order that maximizes the number of high priority block columns that are processed more than two times may be determined (e.g., as described in 706b of FIG. 7, with M=1 and x=1). As shown in Table 2, solution set (a) processes two of the 11 block columns exactly twice, while solution set (b) processes three of the 11 block columns exactly twice. Therefore, solution set (b) is the solution that maximizes the number of high priority block columns that are processed at least two times and is therefore determined as the processing order for the received vector.

In some embodiments, after processing the received vector according to the determined processing order (i.e., processing layers $L_1$, $L_2$, and $L_3$, as determined in solution set (b)), a first hard decision value (e.g., using a decoder) is computed for each bit in the received vector. Each bit in the received vector is then processed a second time, and a second hard decision value is computed for each one of these bits. If no change is detected between the first and second hard decision values for all, or a percentage of all, bits of the received vector, then low power decoding may be enabled and performed. For example, a first hard decision value may be stored in memory for each block column of matrix 900 after processing a first set of layers $L_1$, $L_2$, and $L_3$ (solution set (b)). The high priority block columns are further processed by processing a different set of layers, for example layers $L_0$, $L_4$, and $L_5$ (i.e., solution set (a)). A second hard decision value is then computed based on this processing of the second set of layers. The first and second hard decision values are then compared; if no change is detected, low power decoding may be enabled and performed.

The LDPC decoder may decode the received vector using an iterative process by, for example, performing several iterations of layered decoding until the output of the decoder converges to a valid codeword or until a threshold number of iterations has been reached. In some embodiments, processing multiple solution sets of layers (e.g., solution set (b) $L_1$, $L_2$, and $L_3$, and solution set (a) $L_0$, $L_4$, and $L_5$) may occur during the same iteration of layered decoding. In this case, the disclosed approach would allow to switch to low power decoding early during, e.g., the first iteration of the layered decoding. As discussed above, this may allow for a substantial reduction in power consumption in the decoder by limiting unnecessary processing.

The approaches illustrated in FIGS. 8A, 8B, and 9 show how assigning processing priorities to bits of a received vector (and associated block columns of the parity check matrix of the LDPC code being applied) may determine the order in which these bits or block columns are processed. When the received vector contains punctured bits, these bits may be assigned a high priority (equivalently, top priority) and processed first. Since the locations of punctured bits are fixed and known prior to decoding, a processing order (e.g., a layer order) may be pre-computed, i.e., before decoding starts. Similarly, when defect bits are detected in the received vector, these bits may be assigned a high priority and processed first. Because the defect bits may not be detected until after channel detection (e.g., by defect detector 510 of FIG. 5), the processing order may need to be computed in real time in decoder circuitry. In addition, when the received vector contains undetected defect bits, unknown errors, and/or no punctured bits, all bits of the received vector may be assigned a high priority and processed first. The processing order may also be pre-computed in this case.

Figure 10:
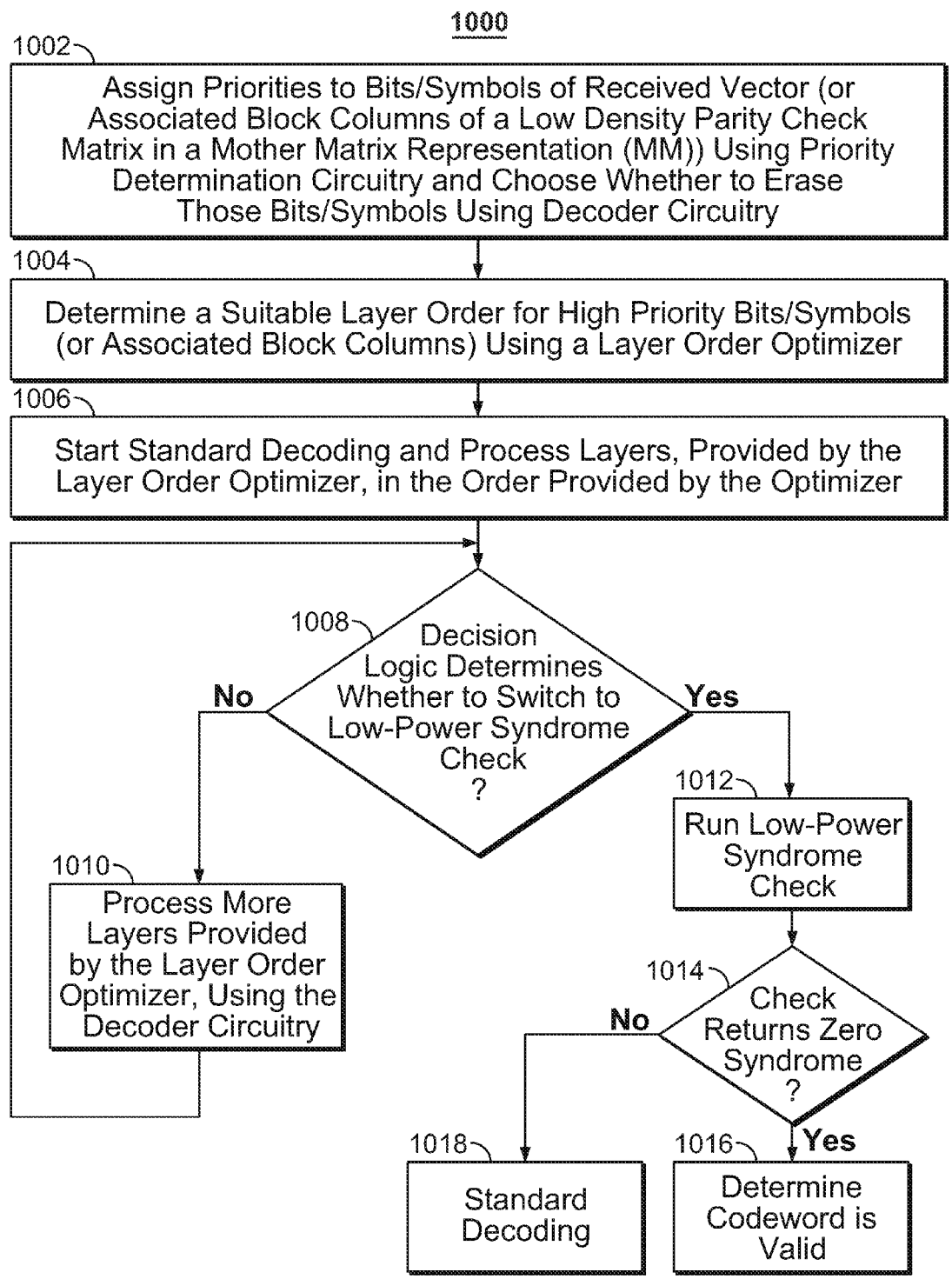
FIG. 10 shows a flowchart of a process for processing a received vector with defects, erasures, and/or puncturing, in accordance with some embodiments.

FIG. 10 shows a flowchart of process 1000 for processing a received vector with defects, erasures, and/or puncturing, in accordance with some embodiments. Process 1000 may be executed by a decoder (e.g., LDPC decoder 116 of FIG. 1, LDPC decoder 520 of FIG. 5, or decoder circuitry 610 of FIG. 6A) to substantially reduce power consumption. Process 1000 includes 1002, 1004, 1006, 1008, 1010, 1012, 1014, 1016, and 1018.

At 1002, high priorities are assigned to bits of the received vector. As described above, these bits may correspond to multiple block columns of a parity check matrix in a mother matrix representation (MM). These block columns of the MM that correspond to at least one or a certain number of high priority bits in the received vector may be assigned a high priority. In some embodiments, block columns that correspond to a greater number of high priority bits in the received vector are assigned a higher priority than other block columns that correspond to fewer high priority bits in the received vector. Additionally, LLR messages associated with bits of the received vector may be erased at 1002 using decoder circuitry based, for example, on a calculated reliability value (i.e., the absolute value of the LLR messages). In some embodiments, a high priority may be assigned to defect, erased or punctured bits, as will be described in FIG. 11A below. In some embodiments, a high priority may be assigned to all bits of the received vector, as will be described in FIG. 11B below. Next, 1004 may be executed.

At 1004, a processing order is determined for bits of the received vector (or associated block columns in the LDPC code's parity check matrix in a mother matrix representation) that have been assigned a high priority in 1002. This may be achieved using order optimizer circuitry (e.g., order optimizer circuitry 614 of FIG. 6A). In some embodiments, the decoder may use a layered approach to decoding by, for example, updating groups of check nodes and check variables in parallel. To accomplish this, check nodes associated with a particular row in an LDPC code's parity check matrix, in a mother matrix representation, may be grouped together. Each block row of the parity check matrix may correspond both to grouped check nodes as well as a layer to be processed during layered decoding. At 1004, a set of layers (or solution set) may be determined that would minimize the number of layers to be processed while ensuring processing high priority bits at least M times (e.g., as described in 706a of FIG. 7). Next, 1006 may be executed.

At 1006, the decoder processes the high priority bits according to the order determined at 1004 (e.g., by order determination circuitry 614 of FIG. 6A). For example, the received vector is processed according to the set of layers determined at 1004, which ensures processing high priority bits at least M times. Then, 1008 may be executed.

At 1008, it may be determined whether to enable and perform low power decoding (e.g., performing low power syndrome check, as described in FIG. 6B above). For example, decision logic circuitry (e.g., similar to decision logic circuitry 621 of FIG. 6B) may make this determination based on any suitable criterion for the high priority bits computed at 1006. Switching to low power decoding may, for example, be done using a Switch-To-Power Save select input (e.g., STPS input 622 of multiplexer 630 of FIG. 6B). In some embodiments, this determination may be made based on a reliability value of high priority bits in the received vector, where the reliability value may be calculated as the absolute value of the LLR messages associated with these bits. For example, decision logic circuitry at 1008 may determine to switch to low power decoding if the reliability values for all, or a certain percentage of all, high priority bits exceed the threshold ThrReliab. In some embodiments, decision logic circuitry at 1008 may determine to switch to low power decoding if all high priority bits have been processed at least M times, and the hard decision values (as calculated by the decoder, for example) for all the high priority bits (or a subset of them) did not change after the $P^{th}$ time they were processed (P>M). For example, low power decoding may be enabled and performed if hard decision values computed after all high priority bits are processed once do not subsequently change after these high priority bits are processed a second time. If, at 1008, it is determined not to switch to low power decoding, 1010 may be executed. If, instead, it is determined at 1008 to switch to low power decoding, 1012 may be executed.

At 1010, the decoder may process additional layers. The order in which these additional layers are processed may be provided by the order optimizer circuitry, similar to 1004. After these additional layers are processed, 1008 may be executed again, and decision logic circuitry may determine again whether to switch to low power decoding based, for example, on computing a reliability value of high priority bits.

At 1012, low power decoding is performed. For example, a low power syndrome check may be performed, and syndromes may be computed based on information from the LLR messages. Syndromes may be computed as described above (by, e.g., syndrome computation unit 632 of FIG. 6B) based on the sign of each value of the LLR messages and the parity check matrix associated with the LDPC code being applied. After syndromes are computed based on the LLR messages, 1014 may be executed.

At 1014, it is determined whether the syndrome computed during the low power syndrome check is equal to a zero-vector. For example, if any one syndrome determined at 1012 is equal to a non-zero number, it may be determined that the received vector is an invalid codeword and 1018 may be executed. If, however, it is determined that all of the syndromes calculated are zero, then 1016 is executed. These determinations are made, e.g., by the convergence logic in the decoder.

At 1018, the received vector is processed further. This processing may be done by normal (i.e., full-blown) decoding circuitry, for example decoder circuitry 624 of FIG. 6B, and may involve reading and writing from and to decoder memory and performing additional iterations of the decoding algorithm (i.e., iterations of layered decoding).

At 1016, it is determined that a valid codeword is found. Thus, the received vector is not processed any further by the decoder. The decoder may then begin to process the next received vector. Because the low power syndrome check is activated when the punctured and/or defect bits have been processed, the low power syndrome check may substantially reduce power consumption (based on unnecessary additional processing) in the decoder.

It should be understood that the above steps of process 1000 may be executed or performed by any type of decoder. Additionally, it should be understood that the above steps of process 1000 may be executed or performed in any order or sequence not limited to the order and sequence shown and described in the figure. Also, some of the above steps of process 1000 may be executed or performed substantially simultaneously where appropriate or in parallel to reduce latency and processing times.

Figure 11A:
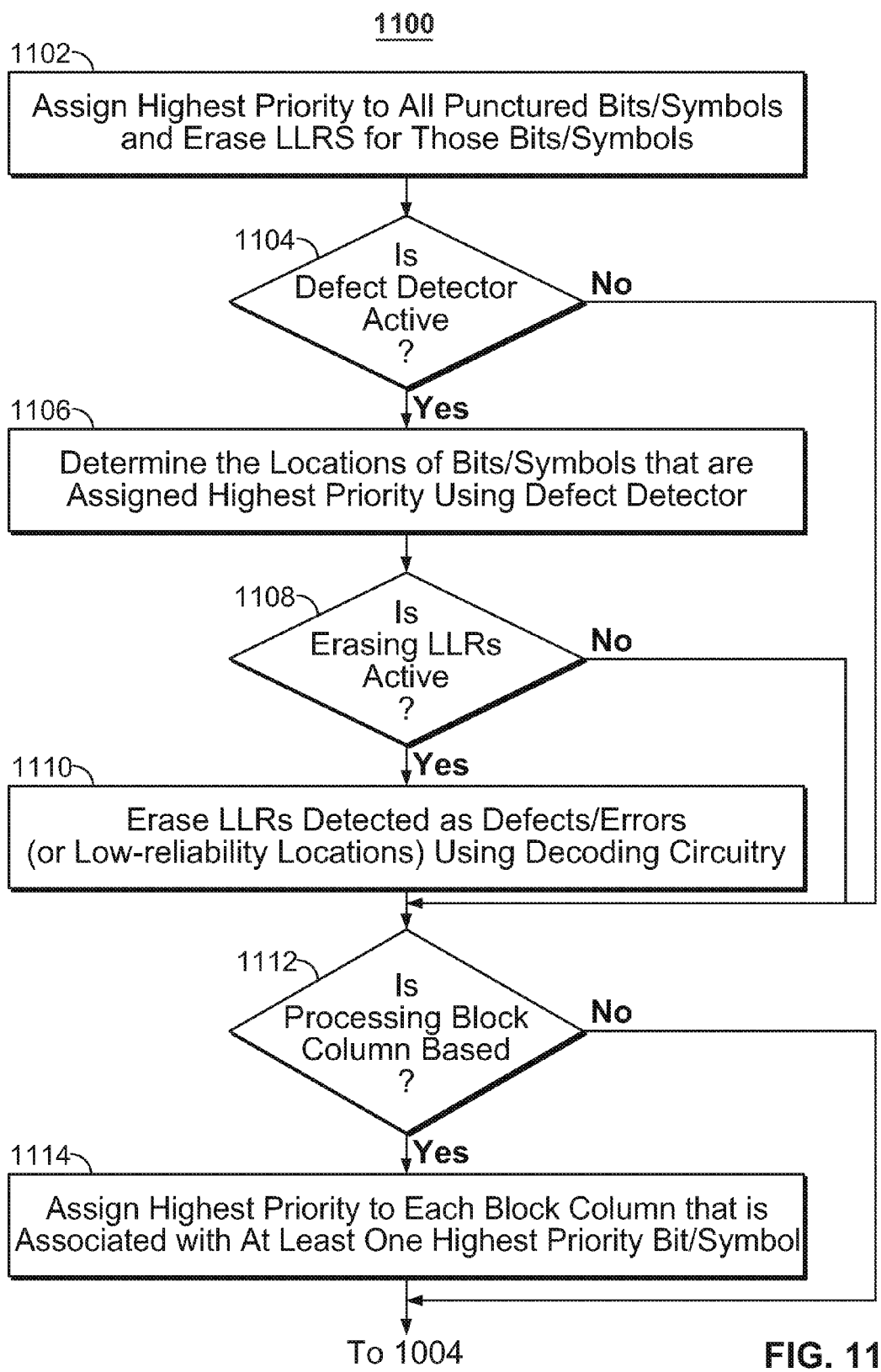
FIGS. 11A and 11B show a flowchart of a process for assigning priorities to bits of a received vector (or associated block columns of a parity check matrix in a mother matrix representation) in accordance with some embodiments.

FIG. 11A shows a flowchart of process 1100 for assigning priorities to bits in a received vector with defect and/or punctured bits (e.g., received vector 114 of FIG. 1, or received vector 509 of FIG. 5) according to some embodiments. Process 1100 may be performed as a part of 1002 in process 1000 of FIG. 10 above (e.g., using decoder 620 of FIG. 6A). Process 1100 includes 1102, 1104, 1106, 1108, 1110, 1112, and 1114.

At 1102, a highest priority is assigned to all punctured bits in the received vector (e.g., using priority determination circuitry 612 of FIG. 6A). As used in process 1100, a highest priority may correspond to an upper end of the range of assigned priorities. As discussed above, punctured bits are bits that have been erased from an encoded codeword before transmitting it through a channel for the purpose of, for example, modifying the data rate of the code. The location of the punctured bits is usually fixed and known by the decoder. At 1102, the LLR messages associated with these punctured bits may be erased (i.e., these bits may be erased). Next, 1104 may be executed.

At 1104, it is determined whether a defect detector (e.g., defect detector 510 of FIG. 5) is enabled in the decoder. If no defect detector is enabled, 1112 is executed next. If, instead, a defect detector is enabled, 1106 is executed and the defect detector is used to determine the locations of defect bits, e.g., of bits with a low reliability value, in the received vector. Defect bits that are detected at 1106 are then assigned a highest priority. Next, 1108 may be executed.

At 1108, it is determined erasing LLR messages (i.e., erasing bits) in the received vector is enabled in the decoder. If erasing LLR messages is enabled, 1112 is executed next. If, however, erasing LLR messages is disabled, 1110 may be executed. At 1110, LLR messages that are associated with defect bits may be erased. As described above, this determination may be made by the defect detector (e.g., defect detector 510 of FIG. 5). Once a defect bit is detected, this associated LLR message may be erased (i.e., the defect bit is erased) at 1110. Next, 1112 may be executed.

At 1112, it is determined whether the decoder processes the received vector using block columns in a parity check matrix in a mother matrix representation. If processing is not block column-based, 1004 from process 100 of FIG. 10 may be executed next. If, however, decoder processing is based on block columns, 1114 is executed and each block column of the parity check matrix in a mother matrix representation is considered. In some embodiments, each block column that is associated with at least one highest priority bit in the received signal is assigned highest priority. In some embodiments, block columns that are associated with a greater number of highest priority bits in the received vector may be assigned a higher priority than block columns with a smaller number of highest priority bits. Next, the priorities assigned using process 1100 may be used to determine a suitable order for processing high priority bits (or associated block columns), as described in 1004 from process 1000 of FIG. 10.

It should be understood that the above steps of process 1100 may be executed or performed in any order or sequence not limited to the order and sequence shown and described in the figure. Also, some of the above steps of process 1100 may be executed or performed substantially simultaneously where appropriate or in parallel to reduce latency and processing times.

Figure 11B:
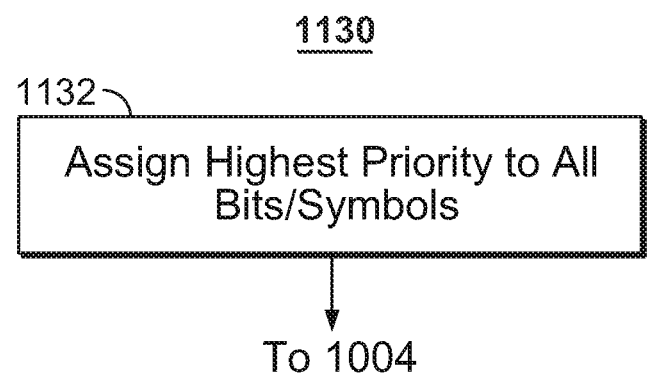

FIG. 11B shows a flowchart of process 1130 for assigning priorities to bits/symbols in a received vector with unknown defects or errors, according to some embodiments. Process 1130 may be performed as a part of 1002 in process 1000 of FIG. 10 above (e.g., using decoder 620 of FIG. 6A). At 1132, all bits of the received vector are assigned highest priority. This may be the case when there is no information on where defect bits are located. Next, the priorities assigned using process 1130 may be used to determine a suitable order for processing high priority bits (or associated block columns), as described in 1004 from process 1000 of FIG. 10. Therefore, because all bits of the received vector (and equivalently all associated block columns of the parity check matrix in a mother matrix representation) are assigned a highest priority, process 1130 would ensure the processing of each bit (i.e., each block column) at least once (or at least M times).

Figure 12:
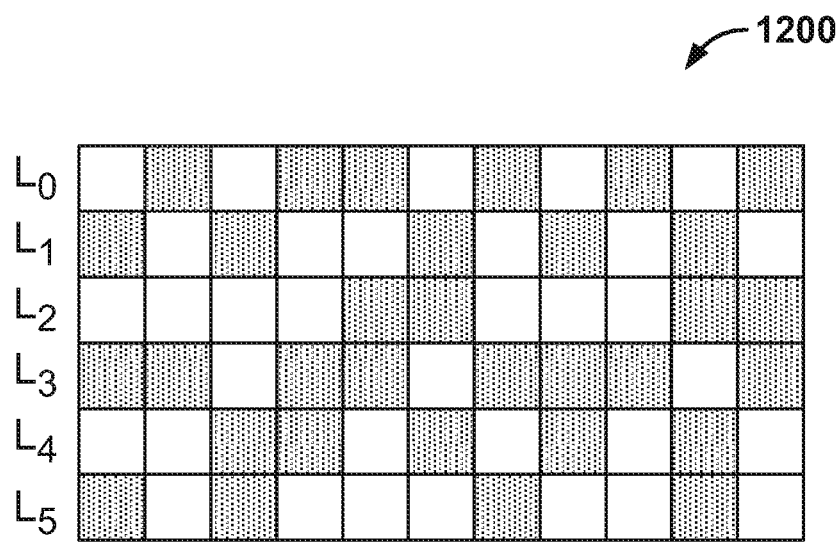
FIG. 12 shows an illustrative example of the processing of a parity check matrix in a mother matrix representation combined with low power decoding in accordance with some embodiments.

FIG. 12 shows an illustrative example of decoder processing of a parity check matrix 1200 combined with low power syndrome check decoding in accordance with some embodiments. In this example, matrix 1200 has 6 block rows and 11 block columns. All bits (and therefore all block columns) may be assigned a high priority. As discussed above, this may be used when there are undetected defect bits and/or unknown error bits.

In an embodiment, each block column is processed at least twice (i.e., M=2). All layers are first selected and assigned a high priority (e.g., as described in 702 of FIG. 7). These layers are then combined into sets of layers that minimize the number of processed layers while processing each high priority block column at least twice (e.g., as described in 704 of FIG. 7). In this example, selecting layers $L_0$, $L_1$, $L_3$, and $L_4$ would minimize the total number of layers to process (four layers) while ensuring that each block column is processed at least twice. In some embodiments, while processing $L_0$, $L_1$, $L_3$, and $L_4$, it may be determined when each block column has been processed a first time, and a first hard decision may be computed based on this first processing of each block column. At the end of processing layers $L_0$, $L_1$, $L_3$, and $L_4$, each block column has been processed at least twice, and a second hard decision may be computed for each block column. If no change is detected in the hard decisions, low power decoding may be enabled and performed.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, while an LDPC decoder is described with relation to the figures included in the present disclosure, this element may be replaced by any type of decoder (e.g., the LDPC decoder could instead or more particularly be any type of layered decoder, any type of flooding decoder, or any other type of decoder). The decoder may also be any variant of these decoders (e.g., a hard decoder, a bit-flipping decoder, a soft decoder, or any other variant of a decoder). Additionally, the decoder may make use of either hard information or soft information to decode incoming information. While certain elements of the figures included in the present disclosure have been described as implemented in a layered LDPC decoder, these components may be implemented in any type of variant of a decoder. For example, these elements may be implemented in an iterative soft decoder, a hard decoder, a bit-flipping decoder, or as stand-alone elements in any device. While a decoding layer corresponded to one block row of a parity check matrix in a mother matrix representation with relation to FIGS. 4, 8A, 8B, 9, and 12, a decoding layer may correspond to a portion of a block row, or to more than one block row, depending on the details of implementation of decoder circuitry. Additionally, decoding layers were described as implemented over rows of an LDPC code's parity check matrix. However, decoding layers may also be defined over any other sets of check nodes and/or variable nodes of the LDPC code's parity check matrix. Layers may also be defined over columns of the parity check matrix. In addition, while certain components of this disclosure have been described as implemented in hardware and others in software, other configurations may be possible.

What is claimed is:

1. A method of processing a vector received from a communications channel, using decoder circuitry, the method comprising:
   assigning a priority to each bit in a group of bits in the received vector, wherein the group of bits includes at least one of a defect bit, an erased bit, and a punctured bit;
   determining an order in which to process each bit in the group based on the assigned priority;
   processing each bit in the group according to the determined order using the decoder circuitry; and
   erasing at least one bit in the group based on the assigned priority.

2. The method of claim 1, wherein the group of bits corresponds to a plurality of columns in a parity check matrix, in which each of the plurality of columns is associated with at least one decoding layer, and wherein the determined order is an ordering of decoding layers.

3. The method of claim 2, wherein each of the plurality of columns is assigned a priority based on a number of high priority bits in the column.

4. The method of claim 1, wherein said assigning a priority to each bit in a group of bits in the received vector comprises assigning a high priority to each punctured bit in the group of bits.

5. The method of claim 1, further comprising determining a reliability value for each bit in the group, wherein said assigning a priority to each bit in the group of bits in the received vector is based on the determined reliability value.

6. The method of claim 1, wherein the processing further comprises:
   computing at least one first value for the bits in the group, wherein each of the at least one first value corresponds to a unique bit in the group, and wherein the unique bit has been processed a first time;
   computing at least one second value for the bits in the group, wherein each of the at least one second value corresponds to the unique bit in the group, and wherein the unique bit has been processed a second time; and
   if each of the at least one first value is equal to each of the at least one second value:
   performing low power decoding on the received vector to output a decoded vector; and
   determining if the decoded vector is valid.

7. The method of claim 6, wherein performing low power decoding comprises performing a low power syndrome check, and wherein determining if the decoded vector is valid is based on a result of the low power syndrome check.

8. The method of claim 1, wherein said assigning a priority to each bit in a group of bits in the received vector comprises assigning a high priority to all of the bits in the group of bits.

9. The method of claim 1, wherein the decoder circuitry comprises a low density parity check (LDPC) decoder.

10. A system for processing a vector received from a communications channel, the system comprising:
    first circuitry configured to assign a priority to each bit in a group of bits in the received vector, wherein the group of bits includes at least one of a
    defect bit, an erased bit, and a punctured bit;

second circuitry configured to determine an order in which to process each bit in the group based on the assigned priority; and decoder circuitry configured to process each bit in the group according to the determined order and to erase at least one bit in the group based on the assigned priority.

11. The system of claim 10, wherein the group of bits corresponds to a plurality of columns in a parity check matrix, in which each of the plurality of columns is associated with at least one decoding layer, and wherein the processing order is an ordering of decoding layers.

12. The system of claim 11, wherein each of the plurality of columns is assigned a priority based on a number of high priority bits in the column.

13. The system of claim 10, wherein the first circuitry is further configured to assign a high priority to each punctured bit in the group of bits.

14. The system of claim 10, wherein the first circuitry is further configured to determine a reliability value for each bit in the group, and wherein the assigned priority to each bit in the group of bits in the received vector is based on the determined reliability value.

15. The system of claim 10, wherein the decoder circuitry is further configured to:

compute at least one first value for the bits in the group, wherein each of the at least one first value corresponds to a unique bit in the group, and wherein the unique bit has been processed a first time;

compute at least one second value for the bits in the group, wherein each of the at least one second value corresponds to the unique bit in the group, and wherein the unique bit has been processed a second time; and if each of the at least one first value is equal to each of the at least one second value:
  perform low power decoding on the received vector to output a decoded vector; and
  determine if the decoded vector is valid.

16. The system of claim 15, wherein the low power decoding comprises a low power syndrome check, and wherein the decoder circuitry determines if the decoded vector is valid based on a result of the low power syndrome check.

17. The system of claim 10, wherein the group of bits in the received vector comprises all of the bits in the group of bits.

18. The system of claim 10, wherein the decoder circuitry comprises a low density parity check (LDPC) decoder.

19. A method of processing a vector received from a communications channel, using decoder circuitry, the method comprising:

assigning a priority to each bit in a group of bits in the received vector, wherein the group of bits includes at least one of a defect bit, an erased bit, and a punctured bit;

determining an order in which to process each bit in the group based on the assigned priority; and processing each bit in the group according to the determined order using the decoder circuitry, wherein the group of bits corresponds to a plurality of columns in a parity check matrix, in which each of the plurality of columns is associated with at least one decoding layer, wherein the determined order is an ordering of decoding layers, and wherein each of the plurality of columns is assigned a priority based on a number of high priority bits in the column.

* * * * *